(12) United States Patent
Yan et al.

(10) Patent No.: US 12,213,266 B2
(45) Date of Patent: Jan. 28, 2025

(54) ELECTRONIC DEVICE

(71) Applicant: Honor Device Co., Ltd., Shenzhen (CN)

(72) Inventors: Bin Yan, Shenzhen (CN); Guotong Zhou, Shenzhen (CN); Dong Ma, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 17/795,100

(22) PCT Filed: Apr. 21, 2022

(86) PCT No.: PCT/CN2022/088272
§ 371 (c)(1),
(2) Date: Jul. 25, 2022

(87) PCT Pub. No.: WO2023/010895
PCT Pub. Date: Feb. 9, 2023

(65) Prior Publication Data
US 2024/0237237 A1 Jul. 11, 2024

(30) Foreign Application Priority Data
Aug. 2, 2021 (CN) .......................... 202110878914.8

(51) Int. Cl.
*H05K 5/02* (2006.01)
*G06F 1/16* (2006.01)
*H05K 5/00* (2006.01)

(52) U.S. Cl.
CPC ......... *H05K 5/0217* (2013.01); *G06F 1/1641* (2013.01); *H05K 5/0086* (2013.01); *H05K 5/0247* (2013.01)

(58) Field of Classification Search
CPC .. H05K 5/0217; H05K 5/0086; H05K 5/0247; H05K 5/02; G06F 1/1641; G06F 1/1626; G06F 1/1637; H04M 1/0262
See application file for complete search history.

(56) References Cited

U.S. PATENT DOCUMENTS

| | | | |
|---|---|---|---|
| 11,233,208 B2 | 1/2022 | Dang et al. | |
| 2014/0255745 A1* | 9/2014 | Choi | H04B 1/3888 |
| | | | 429/96 |

(Continued)

FOREIGN PATENT DOCUMENTS

| | | | |
|---|---|---|---|
| CN | 106707577 A | 5/2017 | |
| CN | 107589579 A | 1/2018 | |

(Continued)

OTHER PUBLICATIONS

Machine translation of CN113095117 (Year: 2024).*

(Continued)

*Primary Examiner* — Sagar Shrestha
(74) *Attorney, Agent, or Firm* — Leydig, Voit & Mayer, Ltd.

(57) ABSTRACT

An electronic device has a middle frame with a middle frame hole. A screen chip and a screen outlet line are located on a first side of the middle frame, a battery is located on a second side of the middle frame, and the screen chip is laminated to a large surface of the screen outlet line. To avoid contact between the middle frame and the screen chip, the middle frame hole accommodates the screen chip, a protruding height of the screen chip relative to the large surface of the screen outlet line is less than a thickness of the middle frame hole, and a distance between the screen chip and the battery is greater than an avoidance distance of the screen chip. The screen chip is prevented from moving downward to be in (Continued)

contact with the middle frame when a user presses the display, thereby avoiding damage.

12 Claims, 13 Drawing Sheets

(56) References Cited

U.S. PATENT DOCUMENTS

| | | | |
|---|---|---|---|
| 2016/0339679 A1* | 11/2016 | Yoon | G06F 1/1633 |
| 2017/0023979 A1* | 1/2017 | Yamazaki | G06F 1/1652 |
| 2017/0142837 A1* | 5/2017 | Kim | H05K 1/147 |
| 2018/0131087 A1* | 5/2018 | Kim | H05K 9/0026 |
| 2018/0164619 A1* | 6/2018 | Kim | G06F 1/1601 |
| 2018/0263151 A1* | 9/2018 | Cho | H04M 1/0262 |
| 2018/0269517 A1* | 9/2018 | Oh | H01M 10/60 |
| 2019/0384091 A1 | 12/2019 | Li et al. | |
| 2021/0011681 A1* | 1/2021 | Won | H04R 9/063 |
| 2021/0132654 A1 | 5/2021 | Yeo et al. | |
| 2022/0117100 A1* | 4/2022 | Yoon | H04M 1/0237 |

FOREIGN PATENT DOCUMENTS

| | | | |
|---|---|---|---|
| CN | 107728365 | A | 2/2018 |
| CN | 108682307 | A | 10/2018 |
| CN | 111223398 | A | 6/2020 |
| CN | 211604133 | * | 9/2020 |
| CN | 111752053 | A | 10/2020 |
| CN | 112804379 | A | 5/2021 |
| CN | 113095117 | A | 7/2021 |
| CN | 113163030 | A | 7/2021 |
| TW | 201834237 | A | 9/2018 |
| WO | 2020097785 | A1 | 5/2020 |
| WO | 2020133905 | A1 | 7/2020 |

OTHER PUBLICATIONS

Lin, Zhihua, "Design and Application of Energy Saving Technology for Flat Panel TV," Video Engineering, No. 06, vol. 33, pp. 52-53 (2009).

* cited by examiner

ELECTRONIC DEVICE

CROSS-REFERENCE TO RELATED APPLICATIONS

This application is a National Stage of International Application No. PCT/CN2022/088272, filed on Apr. 21, 2022, which claims priority to Chinese Patent Application No. 202110878914.8, filed on Aug. 2, 2021. Both of the aforementioned applications are hereby incorporated by reference in their entireties.

TECHNICAL FIELD

This application relates to the field of terminal devices, and in particular, to an electronic device.

BACKGROUND

With continuous improvement of people's living standards, electronic devices such as mobile phones are widely used. An electronic device may include a housing, a screen disposed on the housing, and a middle frame, a screen chip, a screen outlet line, and a battery that are disposed on the housing, where the middle frame is disposed in parallel with the screen, the battery is disposed on a side that is of the middle frame and that is away from the screen, and the screen chip and the screen outlet line are disposed on a side that is of the middle frame and that is close to the screen.

To implement a large-screen display effect of the electronic device, a screen outlet end is generally located in a length direction of the electronic device, the screen chip and the screen outlet line are located just above a battery, and the battery is separated from the screen chip and the screen outlet line by using the middle frame of the housing. However, the screen chip is laminated to the screen outlet line, so that the screen chip forms a protruding structure relative to the screen outlet line. To ensure reliability of components in the electronic device, a gap between the screen chip and the middle frame needs to be greater than a gap between the screen outlet line and the middle frame. Consequently, a locally protruded screen chip increases an overall thickness of the electronic device.

SUMMARY

This application provides an electronic device, so as to resolve a problem that a local protrusion increases an overall thickness.

According to a first aspect, this application provides an electronic device, including a housing, where a display is disposed on the housing, a cavity is formed by the housing and the display, and a middle frame, a screen chip, a screen outlet line, and a battery are disposed in the cavity;
  a middle frame hole is provided on the middle frame, where a thickness of the middle frame hole is equal to a thickness of the middle frame;
  the battery is disposed on a side that is of the middle frame and that is away from the display;
  the screen outlet line is disposed on a side that is of the middle frame and that is close to the display, the screen outlet line is connected to one end of the display, and a large surface of the screen outlet line is located between the display and the middle frame; and
  the screen chip is disposed on the large surface of the screen outlet line, and is located between the middle frame and the large surface of the screen outlet line; and
  a protruding structure formed by the screen chip relative to the large surface of the screen outlet line is located in the middle frame hole, and a protruding height of the protruding structure is less than the thickness of the middle frame hole.

According to a second aspect, this application provides an electronic device, including a housing, where a display is disposed on the housing, a cavity is formed by the housing and the display, and a middle frame, a screen chip, a screen outlet line, and a battery are disposed in the cavity.

A groove is disposed on the middle frame, and a depth of the groove is less than a thickness of the middle frame;
  the battery is disposed on a side that is of the middle frame and that is away from the display;
  the screen outlet line is disposed on a side that is of the middle frame and that is close to the display, the screen outlet line is connected to one end of the display, and a large surface of the screen outlet line is located between the display and the middle frame; and
  the screen chip is disposed on the large surface of the screen outlet line, and is located between the middle frame and the large surface of the screen outlet line; and
  a protruding structure formed by the screen chip relative to the large surface of the screen outlet line is located in the groove.

It can be learned from the foregoing technical solutions that an embodiment of this application provides an electronic device, where a middle frame hole is provided on the middle frame of the device. The screen chip and the screen outlet line are located on a side that is of the middle frame and that is close to the display, the battery is located on a side that is of the middle frame and that is away from the display, and the screen chip is laminated to the large surface of the screen outlet line. To avoid contact between the middle frame and the screen chip, the middle frame hole accommodates the screen chip, a protruding height of the screen chip relative to the large surface of the screen outlet line is less than a thickness of the middle frame hole, and a distance between the screen chip and the battery is greater than an avoidance distance of the screen chip. It can be learned that the electronic device avoids the screen chip by providing the middle frame hole, so that the screen chip is prevented from moving downward to be in contact with the middle frame when a user presses the display, thereby avoiding damage. In addition, in the manner of avoiding the screen chip by the middle frame hole, only a minimum wall thickness that meets a reliability requirement needs to be set for the middle frame. In this avoidance manner, an internal space of the electronic device can be fully used, and the wall thickness of the middle frame can be reduced while the screen chip is avoided, thereby further reducing the overall thickness of the electronic device.

BRIEF DESCRIPTION OF DRAWINGS

To describe technical solutions of this application more clearly, the following briefly describes accompanying drawings required in embodiments. Apparently, a person of ordinary skill in the art may still derive other accompanying drawings from these accompanying drawings without creative efforts.

DESCRIPTION OF EMBODIMENTS

Technical solutions in embodiments of this application will be clearly described with reference to accompanying drawings in embodiments of this application. Apparently, the described embodiments are merely some rather than all of the embodiments of this application. All other embodiments obtained by a person of ordinary skill in the art based on embodiments of this application without creative efforts shall fall within the protection scope of this application.

The terms "first", "second", and the like are used herein for description only, and cannot be understood as indicating or implying relative importance or implicitly indicating the quantity of indicated technical features. Therefore, the features defined with "first", "second", and the like can explicitly or implicitly include one or more of the features. In the description of this application, unless otherwise specified, "a plurality of" means two or more.

In addition, in this application, the orientation terms such as "upper" and "lower" are defined relative to the orientations in which the components in the accompanying drawings are schematically placed. It should be understood that these orientation terms are relative concepts, are used for relative description and clarification, and may be correspondingly changed based on changes in the orientations in which the components are placed in the accompanying drawings.

Figure 1A:
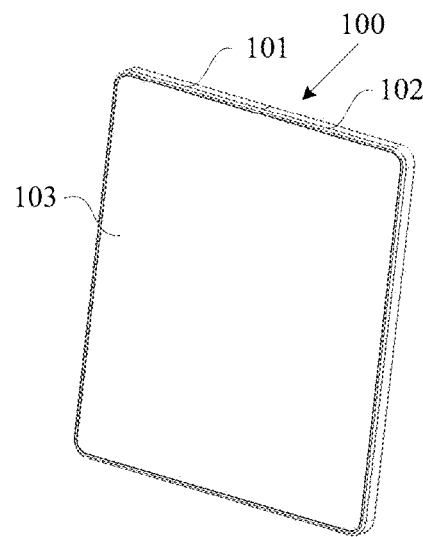
FIG. 1A is a front view of a structure of an electronic device according to an embodiment of this application.
Figure 1B:
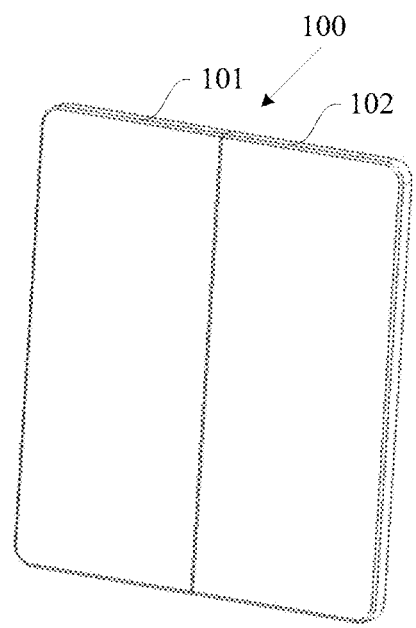
FIG. 1B is a rear view of a structure of an electronic device according to an embodiment of this application.

FIG. 1A is a front view of a structure of an electronic device according to an embodiment of this application; and FIG. 1B is a rear view of a structure of an electronic device according to an embodiment of this application. Referring to FIG. 1A and FIG. 1B, an electronic device 100 provided in an embodiment of this application includes a housing and a display area 103 disposed on the housing, where the display area 103 is provided with a display, and the display may be a bendable display or a flexible display. The housing includes a first frame 101 and a second frame 102. A rotation shaft is disposed between the two frames, and ends that are of two adjacent frames and that are close to the rotation shaft may rotate around the rotation shaft located between the two frames, so that the ends that are of the two frames and that are away from the rotation shaft are relatively close to each other or relatively far away from each other, and the electronic device 100 may correspondingly present different states such as a folded state or an unfolded state.

The display on the display area 103 covers surfaces of the two frames, and may correspondingly present a state such as a folded state or an unfolded state as positions of the two frames change. When the first frame 101 and the second frame 102 are unfolded, the first frame 101 and the second frame 102 are disposed side by side on a same plane. In this case, the display (the display area 103) that covers surfaces of the two frames is unfolded to form a large display surface, and the display surface may be used as a separate display. A state shown in FIG. 1B is a state formed after the structure in FIG. 1A is turned upside down in a horizontal direction.

It should be noted that a quantity of the frames of the electronic device 100 may be two or more, and when the quantity of the frames is more than two, adjacent frames may rotate around mutually parallel rotation shafts to form a multi-layer folded structure, or may expand to obtain a larger display area. In the embodiments of this application, the electronic device 100 is mainly described by using two frames as an example.

Figure 2A:
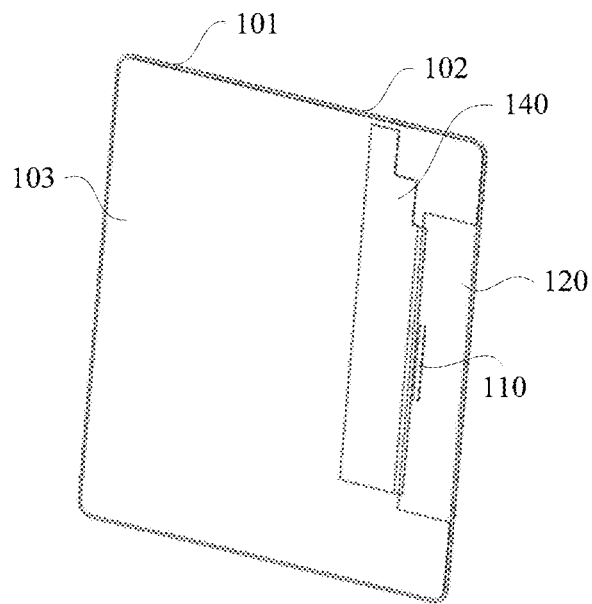
FIG. 2A is a rear view of a display of an electronic device according to an embodiment of this application.
Figure 2B:
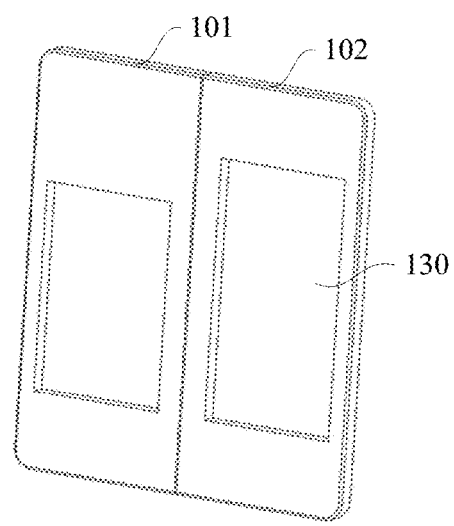
FIG. 2B is a rear perspective view of an electronic device according to an embodiment of this application.
Figure 2C:
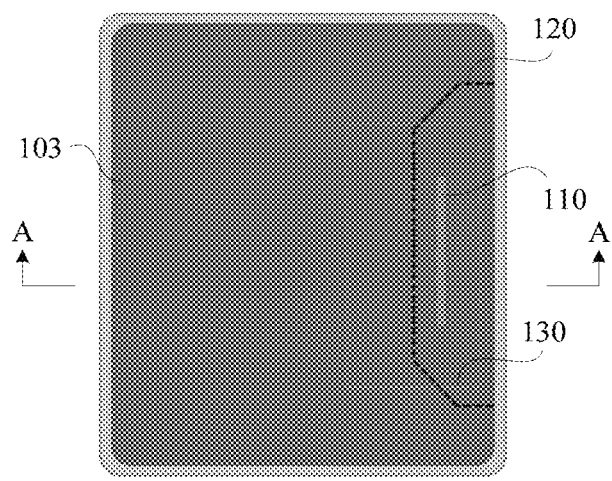
FIG. 2C is an overall perspective view of an electronic device according to an embodiment of this application.

FIG. 2A is a rear view of a display of an electronic device according to an embodiment of this application; FIG. 2B is a rear perspective view of an electronic device according to an embodiment of this application; and FIG. 2C is an overall perspective view of an electronic device according to an embodiment of this application. Referring to FIG. 2A, FIG. 2B, and FIG. 2C, the electronic device 100 includes components in the electronic device, such as a processor, a memory, a camera assembly, a screen chip 110, a screen outlet line 120, a flat cable 140, and a battery 150. For example, components such as the processor, the memory, and the camera assembly may be disposed in the first frame 101 (at a position that is corresponding to the first frame 101 and that is not marked with a reference sign on the left side as shown in FIG. 2B). The second frame 102 may be configured to carry components such as the screen chip 110, the screen outlet line 120, the flat cable 140, and the battery 150.

The screen chip 110, that is, a screen integrated circuit (IC), is a chip configured to drive the display to turn on. The screen chip is made of a fragile material, which is usually glass. The screen chip is fragile after being hit. Therefore, when the screen chip is disposed in the electronic device, a specific avoidance space needs to be reserved between the screen chip and another internal component.

In some embodiments, one screen chip is disposed in the electronic device, so as to turn on the display. However, to improve efficiency of turning on the display, alternatively, two screen chips may be disposed in the electronic device. For example, the two screen chips may be sequentially arranged in a length direction of the device (for example, for an electronic device with a foldable screen, it may be the length direction when the screen is folded).

A screen outlet line 120, that is, a screen COP (chip on pi), is a circuit board formed based on a flexible screen encapsulation process.

The flat cable 140, also referred to as a flexible printed circuit (FPC), is used for data transmission in a moving component and a moving area. In the field of electronic devices, the FPC is a data cable connected to the display on a handset board. The flat cable can be moved, bent, and twisted without damage to a conductor, and can conform to different shapes and special package sizes.

Figure 3:
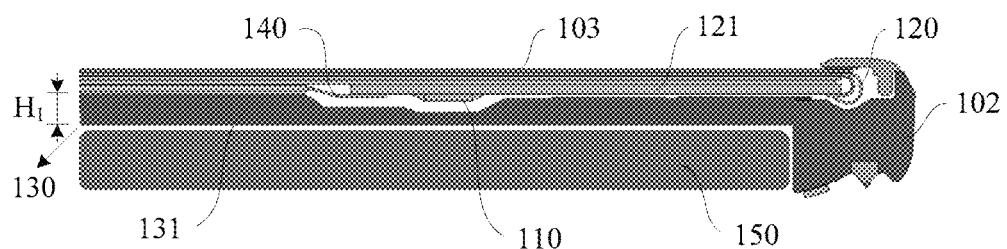
FIG. 3 is a partial sectional view of a cross section A-A in FIG. 2C according to an embodiment of this application.

FIG. 3 is a partial sectional view of a cross section A-A in FIG. 2C according to an embodiment of this application. Referring to FIG. 3, a display on the display area 103 covers the first frame 101 and the second frame 102, and in a direction from the display area 103 to the back of the device, a gasket 121 is laminated to a lower part of the display, a screen outlet line 120 is provided at one end of the display, and the screen outlet line 120 is connected to one end of the display. The screen outlet line 120 is bent along a direction from the display to the back of the device, and a large surface (not shown in the figure) of the screen outlet line 120 is laminated to a lower surface of the gasket 121, that is, a large surface of the screen outlet line 120 is evenly distributed on a surface that is of the gasket 121 and that is close to the back of the device, and the gasket 121 is configured to support the large surface. The screen chip 110 is laminated to a lower part of a large surface of the screen outlet line 120, and the screen chip 110 is located between the middle frame 131 and the large surface of the screen outlet line 120. The large surface of the screen outlet line 120 is not shown in the figure. In a direction from the display area 103 to the back of the device, an internal structure of the electronic device is sequentially as follows: the display, the gasket 121, the large surface of a screen outlet line 120, the screen chip 110, and the middle frame 131.

The flat cable 140 is located between the display and the middle frame 131, and the flat cable 140 is laminated to the lower part of the display, and one end of the flat cable 140 extends to the large surface of the screen outlet line 120, and is laminated to the large surface, which is equivalent to that one end of the flat cable 140 extends to the gasket 121, and the extension end of the flat cable 140 is laminated to a same side of the large surface as the screen chip 110. One end (that is, the extension end) of the flat cable 140 is connected to the screen outlet line 120, and the other end of the flat cable 140 is connected to the processor. Although both the extension end of the flat cable 140 and the screen chip 110 are laminated to the large surface, there is no contact between the extension end of the flat cable 140 and the screen chip 110; and there is a gap between the extension end of the flat cable 140 and the screen chip 110, and a thickness of the extension end of the flat cable 140 is less than or equal to a thickness of the screen chip 110. If the thickness of the extension end of the flat cable 140 is greater than the thickness of the screen chip 110, a higher avoidance space is caused, and the overall thickness increases.

The battery 150 is disposed on a side that is of the screen chip 110 and that is away from the screen, that is, the battery 150 is disposed below the screen chip 110. To fasten the battery 150, the housing of the electronic device forms the battery compartment 130. For example, the battery compartment 130 may be formed in the second frame 102, and the battery 150 is fastened in the battery compartment 130. An opening direction of the battery compartment 130 faces a side that is away from the screen, so that the battery 150 and the screen chip 110 are separated from each other by the bottom of the battery compartment 130.

The bottom of the battery compartment 130 is used as the middle frame 131 of the electronic device, and the middle frame 131 may be disposed in parallel with the display. The screen chip 110, the screen outlet line 120, and the flat cable 140 are disposed above the middle frame 131 (the side that is close to the display), and the battery 150 is disposed below the middle frame 131 (the side that is away from the display). The middle frame 131 is not only used to separate components in the electronic device, but also used to improve stability of the housing of the electronic device. When the user uses the electronic device, and a finger touches the display and presses the display, the screen chip 110, the screen outlet line 120, and the flat cable 140 move downward, and the three components are all located above the battery 150. If the three components move downward, the three components will be in contact with the middle frame 131, so that the middle frame 131 moves downward and is in contact with the battery 150, causing the battery 150 to wear out. Therefore, the battery 150 is separated from the three components by using the middle frame 131, to prevent the three components from continuously moving downward and being in contact with the battery 150, so as to protect the battery 150.

When components are arranged inside the electronic device, to ensure safety of the components, in addition to necessary contact for data transmission, other components without data transmission are not in direct contact, but a specific safety gap needs to be reserved. For example, a safety gap needs to be reserved between the middle frame 131 and the large surface (equivalent to the position of the gasket 121) of the screen outlet line 120, a safety gap needs to be reserved between the middle frame 131 and the flat cable 140, and a safety gap needs to be reserved between the middle frame 131 and the screen chip 110. In some embodiments, the safety gap to be reserved between the middle frame 131 and the large surface of the screen outlet line 120 or the flat cable 140 may be about 0.1 mm.

A thickness of the screen chip 110 is about 0.25-0.3 mm. The screen chip 110 forms a protruding structure relative to the large surface (equivalent to the position of the gasket 121) of the screen outlet line 120, that is, a thickness of the protruding structure is about 0.25-0.3 mm. When the user presses the display, the screen chip 110 moves downward and touches the middle frame 131, and the screen chip 110 is made of a glass material, and is fragile after being hit, causing the screen chip 110 to wear out. Therefore, to protect the screen chip 110 from wearing out, a specific avoidance space needs to be reserved between the screen chip 110 and the middle frame. In some embodiments, while ensuring an avoidance effect, a distance of at least about 0.25 mm needs to be reserved for the avoidance space, that is, an avoidance distance of the screen chip 110 is at least about 0.25 mm.

It can be learned that, to avoid the protruding screen chip 110, the middle frame 131 (that is, the bottom of the battery compartment 130) needs to be moved down toward the back of the device as a whole, which causes the overall thickness of the electronic device to increase. To ensure the overall thickness of the electronic device and avoidance of the screen chip 110, while ensuring a requirement for the gap between the middle frame 131 and the screen outlet line 120, a relative position between the middle frame 131 and the screen chip 110 locally sinks, so that the middle frame 131 presents a locally sunk groove, where the groove is used to accommodate the screen chip 110, and a depth of the groove is less than the thickness of the middle frame 131. During avoidance, the protruding structure formed by the screen chip 110 relative to the large surface of the screen outlet line is located in the groove, and a distance between the screen chip 110 and the bottom of the groove is greater than the avoidance distance of the screen chip 110.

Because the position of the screen chip 110 is close to the position of the flat cable 140, and both the screen chip 110 and the flat cable 140 are laminated to the large surface, the groove formed on the middle frame 131 may also implement avoidance of the flat cable 140. The groove on the middle frame 131 may avoid both the screen chip 110 and the flat cable 140, but the protruding heights of the protruding structures that are formed by the screen chip 110 and the flat cable 140 relative to the screen outlet line 120 are different. Therefore, the structure of the groove may be in an irregular form, provided that avoidance of the screen chip 110 and the flat cable 140 may be implemented.

Based on a reliability requirement of the electronic device, a gap between the screen chip 110 and the middle frame 131 needs to be greater than a gap between the large surface (equivalent to the position of the gasket 121) of the screen outlet line 120 and the middle frame 131, so that a depth of the groove disposed on the middle frame 131 increases. Based on the avoidance solution shown in FIG. 3, to avoid the screen chip 110, the groove is disposed in a local position corresponding to the screen chip 110 on the middle frame 131, the middle frame 131 has a minimum thickness at a position at which the groove is disposed, and the minimum thickness is less than the overall thickness at which the groove is not disposed on the middle frame 131. However, even if the groove is disposed on the middle frame 131, original reliability of the middle frame 131 needs to be ensured. Therefore, an overall thickness of the middle frame 131 needs to be increased, so that a remaining thickness obtained after the groove is locally disposed on the middle frame 131 can still meet the reliability requirement.

For example, in the foregoing avoidance solution, the overall thickness H1 of the middle frame 131 needs to be higher than 0.65 mm, the depth of the groove formed on the middle frame 131 through local sinking needs to be at least greater than 0.25 mm, and the minimum thickness of the position that is of the middle frame 131 and at which the groove is disposed needs to be at least 0.4 mm.

Figure 4:
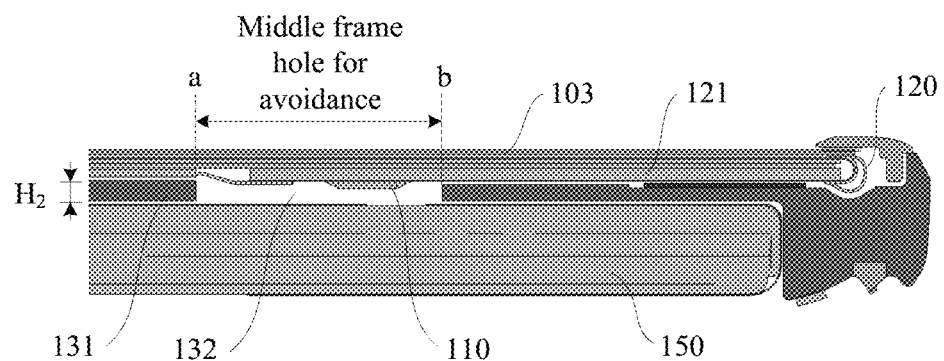
FIG. 4 is a partial sectional view of a cross section A-A when a middle frame hole is provided in a battery compartment according to an embodiment of this application.

To further reduce the overall thickness of the electronic device, in the electronic device provided in another embodiment of this application, internal components of the electronic device are improved. That is, as shown in FIG. 4, a hole is provided at a position that is at the bottom (that is, the middle frame 131) of the battery compartment 130 and that is opposite to the screen chip 110, a middle frame hole 132 is formed on the middle frame 131, the middle frame hole 132 is a through hole, and a depth of the middle frame hole 132 is equal to the thickness of the middle frame 131. Avoiding the protruding screen chip 110 by using the middle frame hole 132 does not cause a thickness of the remaining position of the middle frame 131 to increase, thereby reducing the overall thickness. On a side close to the screen, a black structure (not marked in the figure) between the large surface of the screen outlet line 120 and the middle frame 131 is an adhesive, and the adhesive is used to stick the screen outlet line and the middle frame 131 together for cushioning and waterproofing.

In some embodiments, the electronic device may be a device with a foldable screen, a tablet computer, or the like. The solution provided in this embodiment of this application may be applicable to a case in which the screen chip becomes a bottleneck of the overall thickness due to a battery disposed below the screen chip or another reason.

FIG. 4 is a partial sectional view of a cross section A-A when a middle frame hole is provided in a battery compartment according to an embodiment of this application. Referring to FIG. 4, in the electronic device, to enable the middle frame 131 to avoid a protruding screen chip 110, a position corresponding to the screen chip 110 on the middle frame 131 is hollowed out to form a middle frame hole 132. In this case, the position of the middle frame 131 relative to the screen chip 110 has no thickness. A relative position between the middle frame 131 and the large surface of the screen outlet line 120 is set based on a minimum safety gap. When a distance between the middle frame 131 and the large surface meets a requirement for a minimum safety gap, the protruding screen chip 110 is embedded in the middle frame hole 132. In this case, the entire screen chip 110 is in the middle frame hole 132, and the screen chip 110 is accommodated by using a space of the middle frame hole 132; a protruding structure formed by the screen chip 110 relative to the large surface of the screen outlet line is located in the middle frame hole 132, and a protruding height of the protruding structure is less than a thickness of the middle frame hole 132; and a distance between the screen chip 110 and the battery 150 is greater than an avoidance distance of the screen chip 110.

In this case, even if the user presses the display to drive the screen chip 110 to move downward, the screen chip 110 is not in contact with the middle frame hole 131, thereby preventing the screen chip 110 from wearing out. In addition, at a position in which the bottom of the battery compartment 130 overlaps the screen chip 110, a wall thickness of the middle frame 131 is cut off, and the screen chip 110 does not need to be avoided in the manner shown in FIG. 3, thereby further reducing a thickness of the middle frame, and making full use of an internal space of the electronic device.

In this embodiment of this application, to reduce the overall thickness, the overall thickness of the middle frame 131 of the electronic device needs to be as thin as possible while ensuring reliability of the electronic device. For example, the overall thickness of the middle frame 131 should be set to at least 0.4 mm. According to the electronic device provided in this embodiment, the protruding screen chip 110 is avoided by providing the middle frame hole 132 on the middle frame 131, and the screen chip 110 does not need to be accommodated by using a groove. Therefore, the middle frame 131 does not need to relatively thick, that is, the thickness of the middle frame 131 adjacent to the screen or the thickness of the middle frame 131 in contact with the battery 150 (for example, the bottom of the battery compartment 130) is set to a minimum wall thickness that can ensure reliability. For example, the thickness of the middle frame 131 adjacent to the screen may be set to 0.4 mm, or the thickness of the middle frame 131 in contact with the battery may be set to 0.4 mm.

In the avoidance solution shown in FIG. 3, the overall thickness H1 of the middle frame 131 is greater than 0.65 mm; while in the solution provided in this embodiment of this application shown in FIG. 4, the overall thickness H2 of the middle frame 131 may be set to a minimum wall thickness of 0.4 mm. Therefore, it can be learned from the comparison that the thickness of the middle frame 131 shown in FIG. 4 in this embodiment of this application is less than the thickness of the middle frame 131 shown in FIG. 3. Therefore, the overall thickness of the electronic device can be further reduced by reducing the thickness of the middle frame 131.

In some embodiments, a size of the middle frame hole 132 needs to fit a size of the screen chip 110. From a perspective of reliability, the size of the middle frame hole 132 should not be too large. From a perspective of avoiding the screen chip 110, the size of the middle frame hole 132 should not be too small.

Figure 5A:
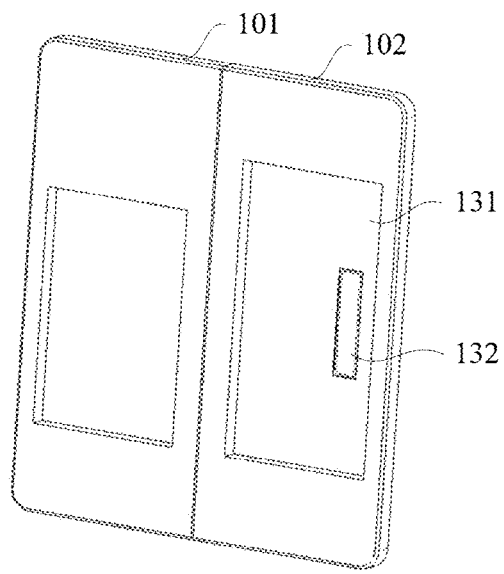
FIG. 5A is a rear perspective view when a middle frame hole is provided in a battery compartment according to an embodiment of this application.
Figure 5B:
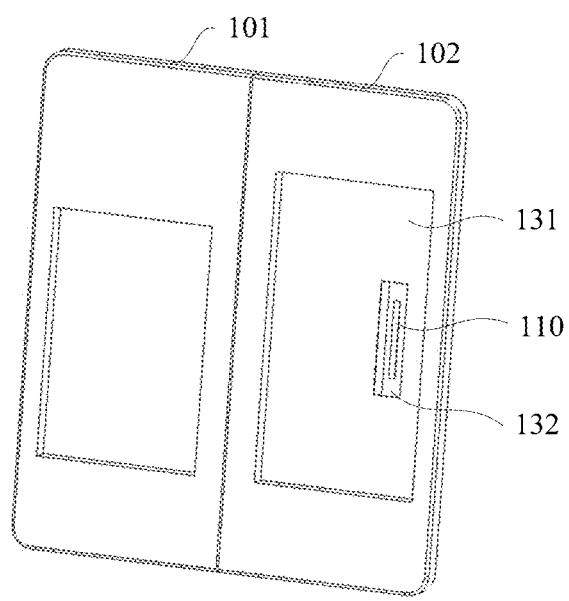
FIG. 5B is a rear perspective view when a screen chip is accommodated by a middle frame hole according to an embodiment of this application.

FIG. 5A is a rear perspective view when a middle frame hole is provided in a battery compartment according to an embodiment of this application; and FIG. 5B is a rear perspective view when a screen chip is accommodated by a middle frame hole according to an embodiment of this application. Referring to FIG. 5A, because the screen chip 110 is of an elongated structure in a length direction of the device, to ensure that the middle frame hole 132 provided on the middle frame 131 can easily accommodate the screen chip 110, the middle frame hole 132 may also be of an elongated structure in the length direction of the device, such as a rectangular structure. In another embodiment, the middle frame hole 132 may alternatively be in another shape, such as a rounded rectangular shape, an oval shape, or the like.

Referring to FIG. 5B, when the screen chip 110 is accommodated by the middle frame hole 132, the screen chip 110 may be embedded in the middle frame hole 132 because the middle frame hole 132 corresponds to a position of the screen chip 110 relative to the middle frame 131.

To ensure that space of the middle frame hole 132 can accommodate the screen chip 110 and that reliability of the middle frame hole 132 is not affected, a size of the middle frame hole 132 is slightly larger than a size of the screen chip 110. For example, the middle frame hole 132 is offset from the screen chip 110 by a specific distance, and the offset distance may be set to about 1 mm. For example, the offset distance is greater than 1 mm. From a perspective of the overall offset size, a length of the middle frame hole 132 is greater than a length of the screen chip 110 by about 2 mm, and a width of the middle frame hole 132 is greater than a width of the screen chip 110 by about 2 mm.

Referring to FIG. 4 again, because the extension end of the flat cable 140 is laminated to the large surface (equivalent to the position of the gasket 121) of the screen outlet line 120, the extension end of the flat cable 140 is also higher than the large surface to form a protruding structure. The thickness of the extension end of the flat cable 140 is less than or equal to the thickness of the screen chip 110 (that is, a protruding height relative to the large surface of a screen outlet line), so as to prevent a larger avoidance space from being generated at the middle frame 131, thereby avoiding a greater overall thickness.

In this case, the middle frame hole 132 needs to avoid the extension end of the flat cable 140 while avoiding the screen chip 110. Therefore, the extension end of the flat cable 140 is located in the middle frame hole 132, and the size of the middle frame hole 132 is greater than a total size that is enclosed by the screen chip 110 and the extension end of the flat cable 140, that is, the size of the middle frame hole 132 is greater than an outer size of an overlapping part between the screen chip 110+the extension end of the flat cable and the large surface of the screen outlet line 120. In a width direction of the electronic device, a start position (a) on one side of the middle frame hole 132 may be opposite to a start position at which the extension end is generated by the flat cable 140, and another end position (b) on the other side of the middle frame hole 132 may be a position corresponding to a minimum distance required when the middle frame hole 132 is offset from the screen chip 110.

According to the electronic device provided in this embodiment of this application, because of a relative position relationship between and structural characteristics of the screen chip 110 and the screen outlet line 120, the screen chip 110 forms a protruding structure relative to the large surface of the screen outlet line 120. While it is ensured that the middle frame 131 and the large surface meet a requirement for a minimum safety gap, to avoid contact between the middle frame 131 and the screen chip 110, the middle frame 131 needs to avoid the screen chip 110. In an avoidance manner in this embodiment of this application, the middle frame hole 132 is disposed at a position of the middle frame 131 relative to the screen chip 110, and the middle frame hole 132 accommodates the screen chip 110, so as to prevent the screen chip 110 from moving downward and being in contact with the middle frame 131 to cause damage because the user presses the display. In addition, when the screen chip 110 is avoided by the middle frame hole 132, only a minimum wall thickness that meets a reliability requirement needs to be set. It can be learned that, in this avoidance manner, the internal space of the electronic device can be fully used, and the wall thickness of the middle frame 131 can be reduced while the screen chip 110 is avoided, thereby further reducing the overall thickness of the electronic device.

In some embodiments, to avoid the screen chip 110, the middle frame hole 132 is disposed in a hollow-out manner at a relative position at the bottom (the middle frame 131) of the battery compartment 130. In this case, the screen chip 110 is not separated from the battery 150 by the middle frame 131. In this case, if the user presses the display hard, the screen chip 110 sinks due to applied force. Because the position of the screen chip 110 is no longer blocked by the middle frame 110, the screen chip 110 may sink excessively and be in contact with the battery 150.

When the screen chip 110 is in contact with the battery 150, the screen chip 110 may be damaged. In addition, if the screen chip 110 is broken, debris generated by the screen chip 110 may pierce the battery 150, which affects use of the battery 150. In addition, the middle frame hole 132 provided on the middle frame 131 may reduce reliability of the middle frame 131. Therefore, from a perspective of avoiding significant deformation of and damage to the screen chip 110 and protecting the battery 150, a reinforcement member 160 may be disposed at the position of the middle frame hole 132, the reinforcement member 160 is located between the screen chip 110 and the battery 150, and the reinforcement member 160 is fastened around the middle frame hole. The reinforcement member 160 is used for supporting and positioning, so as to improve reliability of the middle frame 131 and avoid significant deformation of the screen chip 110 due to applied force. The reinforcement member 160 prevents the screen chip 110 from continuously sinking, to avoid damage caused by contact between the screen chip 110 and the battery 150, and prevent the battery 150 from being damaged by the screen chip 110, so as to avoid a risk.

Figure 6A:
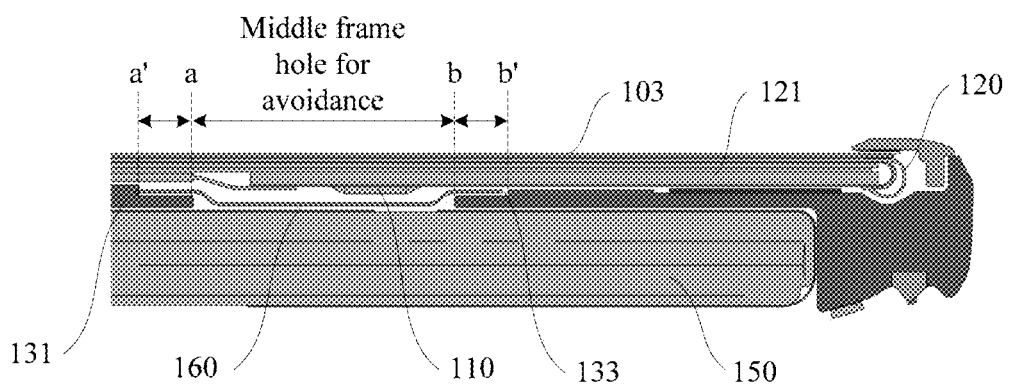
FIG. 6A is a schematic diagram of a structure when a reinforcement member is disposed at a position of a middle frame hole according to an embodiment of this application.
Figure 6B:
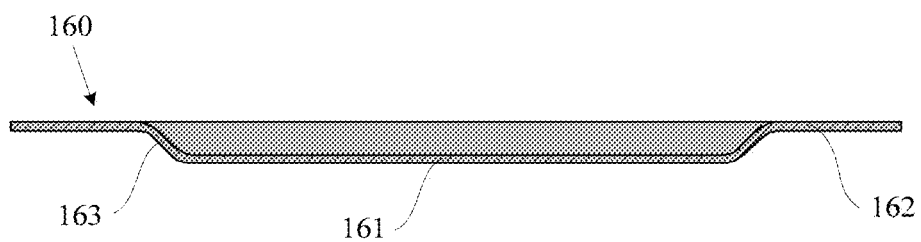
FIG. 6B is a sectional view of a reinforcement member according to an embodiment of this application.

FIG. 6A is a schematic diagram of a structure when a reinforcement member is disposed at a position of a middle frame hole according to an embodiment of this application; and FIG. 6B is a sectional view of a reinforcement member according to an embodiment of this application. Referring to FIG. 6A and FIG. 6B, on the basis of the solution for reducing the overall thickness of the electronic device provided in the foregoing embodiment, the reinforcement member 160 is disposed at the position of the middle frame hole 132, and the reinforcement member 160 includes a bottom edge 161, a skirt edge 162, and a middle edge 163. The bottom edge 161 is of a solid structure, and both the skirt edge 162 and the middle edge 163 are of a hollow annular structure. For example, a material of the reinforcement member 160 may be a steel material, so as to ensure reliability.

The skirt edge 162 surrounds the bottom edge 161 by using the middle edge 163. A plane on which the bottom edge 161 is located and a plane on which the skirt edge 162 is located are parallel but not overlapped. That is, after being connected by using the middle edge 163, the plane on which the bottom edge 161 is located and the plane on which the skirt edge 162 is located are spaced by a specific distance in a parallel direction, so that a cross section of the reinforcement member 160 is of a groove structure, where the groove structure is used to accommodate the screen chip 110, and a depth of the groove structure is greater than an avoidance distance of the screen chip 110.

The middle edge 163 may be separately connected to the bottom edge 161 and the skirt edge 162 in a vertical state. In this case, the planes on which two adjacent edges of the reinforcement member 160 are located are perpendicular to each other, and a size of the bottom of a groove formed by the reinforcement member 160 is the same as a size of an opening. The middle edge 163 may alternatively be connected to both the bottom edge 161 and the skirt edge 162 in an inclined state. In this case, the planes on which two adjacent edges of the reinforcement member 160 are located are not perpendicular to each other, and a size from the bottom of a groove formed by the reinforcement member 160 to an opening gradually increases, as shown in FIG. 6B.

During mounting of the reinforcement member 160, the reinforcement member 160 is mounted in the middle frame hole 132 in a concave state with the bottom edge 161 at the bottom and the skirt edge 162 at the top, so that the skirt edge 162 is fastened to the middle frame 131 around the middle frame hole 132, and the skirt edge 162 is located between the middle frame 131 and the large surface of the screen outlet line 120. To avoid the screen chip 110 while improving reliability of the middle frame 131, the groove formed by the reinforcement member 160 accommodates the screen chip 110. As shown in FIG. 6A, the skirt edge 162 of the reinforcement member 160 is higher than the bottom edge 161, the bottom edge 161 is close to the battery 150, and the skirt edge 162 is close to the position of the large surface of the screen outlet line 120 (equivalent to the position of the gasket 121).

The bottom edge 161 of the reinforcement member 160 is located on a side that is of the middle frame hole 132 and that is away from the screen chip 110, that is, the side that is close to the battery 150, and the distance between the bottom edge 161 and the screen chip 110 is greater than the avoidance distance of the screen chip 110, that is, a depth of the groove formed by the reinforcement member 160 is greater than the avoidance distance of the screen chip 110. Therefore, the reinforcement member 160 is fastened to the middle frame 131, so that reliability of the middle frame 131 can be improved, and the screen chip 110 can be avoided.

The screen chip 110 is separated from the battery 150 by using the bottom edge 161 of the reinforcement member 160. If the screen chip 110 significantly deforms when the user presses the display, the bottom edge 161 of the reinforcement member 160 may prevent the screen chip 110 from continuously sinking, so as to avoid contact with the battery 150. Even if the screen chip 110 is damaged because of contact with the bottom edge 161, the reinforcement member 160 may hold fragments, to prevent the fragments from being in contact with the battery 150, thereby protecting the battery 150.

Figure 7:
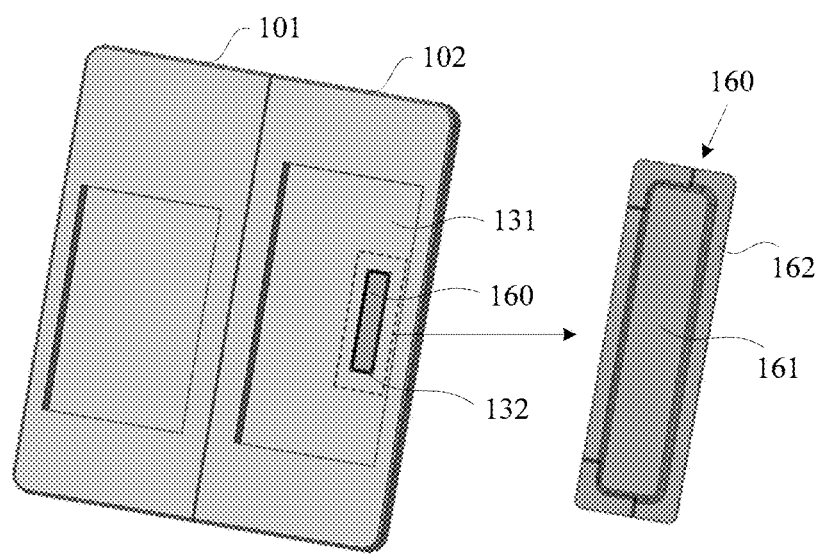
FIG. 7 is a rear perspective view when a reinforcement member is disposed at a position of a middle frame hole according to an embodiment of this application.

FIG. 7 is a rear perspective view when a reinforcement member is disposed at a position of a middle frame hole according to an embodiment of this application. Referring to FIG. 7, a middle frame hole 132 is disposed at a position that is corresponding to the screen chip 110 and that is at the bottom (a middle frame 131) of the battery compartment 130, and the reinforcement member 160 is disposed at the position of the middle frame hole 132. From a perspective of the rear perspective view, the middle frame hole 132 passes through the bottom edge 161 of the reinforcement member 160.

The dashed-line box in the left structure shown in FIG. 7 is a boundary of the reinforcement member 160, that is, a boundary position of the skirt edge 162. A complete structure obtained after the reinforcement member 160 is taken out from the electronic device is shown by a right structure shown in FIG. 7. The reinforcement member 160 is a rounded rectangular structure with a protruding center, and a position of the protruding center is corresponding to a protruding structure of the screen chip 110, so as to implement an effect of accommodating the screen chip 110 by a protruding part of the reinforcement member 160.

An overall thickness of the reinforcement member 160 is less than a wall thickness of the middle frame 131, that is, a vertical distance from the bottom edge 161 to the skirt edge 162 is less than the wall thickness of the middle frame 131, which is equivalent to that a vertical height of the middle edge 163 is less than the wall thickness of the middle frame 131. A distance between the bottom edge 161 and the battery 150 may be greater than or equal to a distance between the battery 150 and a side that is of the middle frame 131 and that is close to the battery 150, so that when the reinforcement member 160 is fastened on the middle frame 131, the middle frame hole 132 passes through the bottom edge 161, and the bottom of the middle frame 131 is not exposed, where the bottom of the middle frame 131 is the side that is close to the battery 150. In this case, the bottom edge 161 is separated from the bottom of the middle frame 131 by a specific distance, which can prevent the bottom edge 161 from being in contact with the battery 150. For example, the distance between the bottom edge 161 and the bottom of the middle frame 131 may be set to 0.1-0.15 mm.

In some embodiments, the skirt edge 162 is fastened on the middle frame 131, and the skirt edge 162 is located between the middle frame 131 and the large surface (equivalent to the position of the gasket 121). A minimum safety gap is reserved between the middle frame 131 and the large surface, and the reinforcement member 160 needs to have a specific thickness to ensure strength of the reinforcement member 160, where the thickness is greater than the minimum safety gap. Therefore, to avoid that when the skirt edge 162 is fastened between the middle frame 131 and the large surface, because a gap between the middle frame 131 and the large surface needs to be increased, the overall thickness of the electronic device increases, a clamping slot 133 may be disposed at a position in which the skirt edge 162 is laminated to the middle frame 131. The clamping slot 133 is used to fasten the skirt edge 162, the clamping slot 133 is located around the middle frame hole 132 and is close to the large surface, and a depth of the clamping slot 133 is greater than a thickness of the skirt edge 162.

Figure 8:
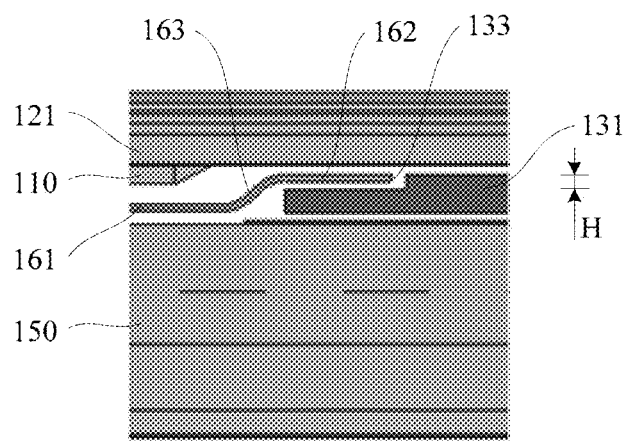
FIG. 8 is a partially enlarged diagram when a clamping slot is disposed on a middle frame according to an embodiment of this application.

FIG. 8 is a partially enlarged diagram when a clamping slot is disposed on the middle frame according to an embodiment of this application. Referring to FIG. 8, the clamping slot 133 is disposed through sinking at the position that is of the middle frame 131 and that is close to the middle frame hole 132. When the reinforcement member 160 is disposed, the skirt edge 162 is laminated to the clamping slot 133, so as to fasten the reinforcement member 160. For example, the skirt edge 162 may be laminated to the clamping slot 133 on the middle frame 131 through glue dispensing or spot welding or by using an adhesive, or the like, so as to fasten the reinforcement member 160 to the edge of the middle frame hole 132, so that the reinforcement member 160 is fastened to the middle frame 131 as a whole.

To avoid that when the skirt edge 162 of the reinforcement member 160 is laminated to the clamping slot 133, a top of the skirt edge 162 is exposed beyond a top of the middle frame 131, where the top of the middle frame 131 is a side close to the large surface, consequently, a safety gap between the middle frame 131 and the large surface increases. If the safety gap between the middle frame 131 and the large surface increases, the overall thickness of the electronic device increases. Therefore, in this embodiment of this application, a depth H of the clamping slot 133 is set to be greater than a sum of a thickness of the reinforcement member 160 and a thickness of the glue dispensing (or spot welding or adhesive) layer, so that the top of the skirt edge 162 is lower than the top of the middle frame 131, so as to ensure that a minimum safety gap is reserved between the middle frame 131 and the large surface, thereby reducing the overall thickness of the electronic device.

For example, a thickness of the glue dispensing (or spot welding or adhesive) layer between the skirt edge 162 and the clamping slot 133 is about 0.1 mm, and the thickness of the skirt edge 162 is about 0.1 mm. Therefore, the depth H of the clamping slot 133 is greater than 0.2 mm. A depth tolerance of the clamping slot 133 may be set to 0.05 mm, and therefore the depth H of the clamping slot 133 may be 0.25 mm. A purpose of setting the depth tolerance of the clamping slot 133 is to ensure that the height of the skirt edge 162 is lower than the height of the middle frame 131 by 0.05 mm when the skirt edge 162 is fully accommodated by the clamping slot 133 on the middle frame 131.

A width of the clamping slot 133 disposed on the middle frame 131 may match a width of the skirt edge 162, provided that the width of the clamping slot 133 can fully accommodate the skirt edge 162, so as to ensure stability of the skirt edge 162. For example, if the width of the skirt edge 162 is about 1-1.5 mm, the width of the clamping slot 133 may also be set to 1-1.5 mm.

According to the electronic device provided in this embodiment of this application, to reduce the overall thickness of the electronic device, the middle frame hole 132 is disposed at the position of the middle frame 131 relative to the screen chip 110, the middle frame hole 132 accommodates the screen chip 110, and the middle frame 131 has a minimum wall thickness. However, in this case, the screen chip 110 is not separated from the battery 150 by the middle frame 131, and the screen chip 110 will excessively sink after being stressed and be in contact with the battery 150. Therefore, the reinforcement member 160 is disposed at a position of the middle frame hole 132, and the reinforcement member 160 is used for supporting and positioning, so as to improve reliability of the middle frame 131 and prevent the screen chip 110 from continuously sinking, thereby avoiding damage caused by contact between the screen chip 110 and the battery 150 and protecting the battery 150. In addition, the clamping slot 133 is disposed at a contact position between the middle frame 131 and the reinforcement member 160, and the skirt edge 162 of the reinforcement member 160 is accommodated by using the clamping slot 133, so as to avoid that the top of the skirt edge 162 is exposed beyond the top of the middle frame 131. Therefore, the safety gap between the middle frame 131 and the large surface of the screen outlet line 120 (equivalent to the position of the gasket 121) increases, so as to ensure that a minimum safety gap is reserved between the middle frame 131 and the large surface of the screen outlet line 120, thereby reducing the overall thickness of the electronic device.

Figure 9:
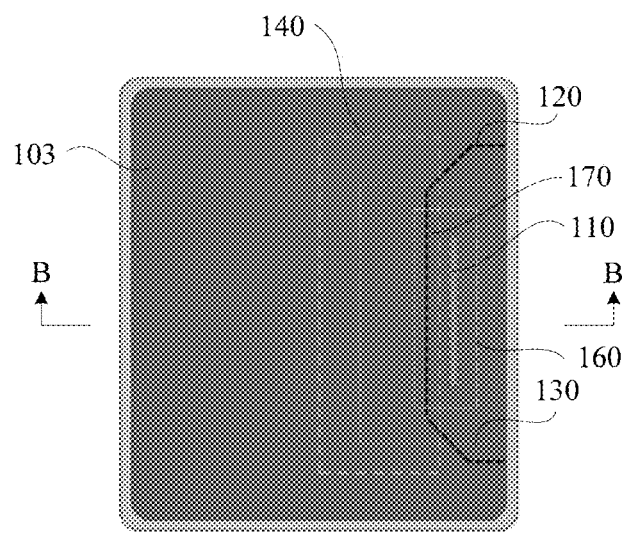
FIG. 9 is a rear perspective view when a reinforcement member is disposed in an electronic device according to an embodiment of this application.
Figure 10:
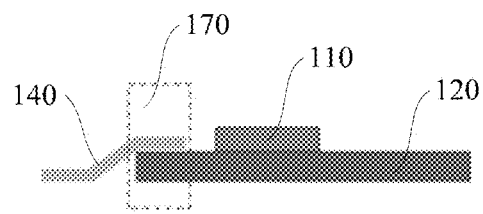
FIG. 10 is a partial sectional view of a cross section B-B in FIG. 9 according to an embodiment of this application.

FIG. 9 is a rear perspective view when a reinforcement member is disposed in an electronic device according to an embodiment of this application; and FIG. 10 is a partial sectional view of a cross section B-B in FIG. 9 according to an embodiment of this application. In some embodiments, referring to FIG. 9 and FIG. 10, because the extension end of the flat cable 140 is in contact with the large surface of the screen outlet line 120, a contact position between the extension end of the flat cable 140 and the large surface of the screen outlet line 120 is a contact area 170. If the reinforcement member 160 is disposed at the position of the middle frame hole 132 in the electronic device, the contact position between the reinforcement member 160 and the middle frame 131 passes through the contact area 170 that is formed by the extension end of the cable 140 and the large surface. However, in the contact area 170, the flat cable 140 is higher than the large surface by a height of one layer of the flat cable 140, and when the reinforcement member 160 passes through the contact area 170, the flat cable 140 is also higher than the contact area 170 by a thickness of one layer of the flat cable 140. In this case, a height of a position at which the reinforcement member 160 passes through the contact area 170 is higher than a height of a position at which the reinforcement member 160 does not pass through the contact area 170 by a thickness of one layer of the flat cable 140, and the height herein refers to a height relative to the large surface. To match the extra thickness of the position at which the reinforcement member 160 passes through the contact area, the accommodating area inside the electronic device is increased in a thickness direction (that is, a direction from the display to the rear housing), thereby affecting the overall thickness of the electronic device.

With reference to FIG. 7, when the screen chip 110 protruding relative to the screen outlet line 120 is accommodated by using the reinforcement member 160, a protruding portion of the reinforcement member 160 faces the back of the electronic device (facing the battery), and an opening portion of the reinforcement member 160 faces the front of the electronic device (facing the display). When the reinforcement member 160 is mounted at the position of the middle frame hole 132, a part of the skirt edge 162 of the reinforcement member 160 passes through the contact area 170 that is formed by the extension end of the flat cable 140 and the large surface of the screen outlet line 120. Therefore, the increased height (the thickness of the flat cable 140) of the reinforcement member 160 when the reinforcement member passes through the contact area 170 may be removed by changing the structural form of the reinforcement member 160. For example, if the height of the flat cable 140 is about 0.1-0.15 mm, the increased height that is of the reinforcement member 160 when the reinforcement member passes through the contact area 170 and that needs to be removed is also about 0.1-0.15 mm.

In some embodiments, a part that is of the reinforcement member 160 and that is above the contact area 170 is cut off, that is, a part that is of the skirt edge 162 and that passes through the contact area 170 is directly cut off, so as to form the reinforcement member 160 with the notched skirt edge 162; and the remaining part of the skirt edge 162 is fastened to the middle frame 131, so as to prevent the overall thickness of the electronic device from being increased due to a local thickness of the reinforcement member 160. The thickness of the skirt edge 162 is usually 0.1 mm. If an area that is of the contact area 170 and that is adjacent to the reinforcement member 160 cannot be accommodated after a part of the skirt edge 162 is cut off, a part of the middle edge 163 may be further cut off, that is, a part that is of the middle edge 163 and that is adjacent to the skirt edge may be cut off.

Figure 11A:
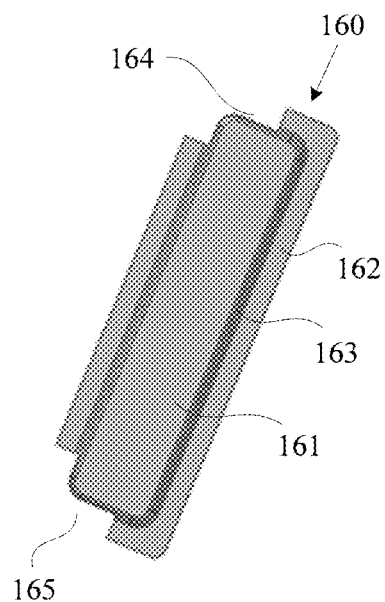
FIG. 11A is a schematic diagram of a structure of a reinforcement member with a notched skirt edge viewed from a protruding side of a bottom edge according to an embodiment of this application.
Figure 11B:
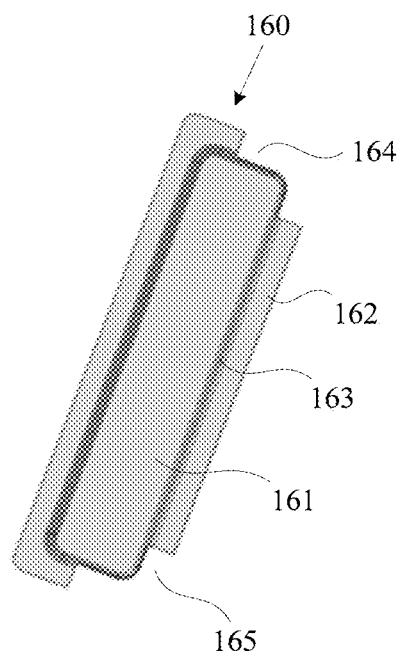
FIG. 11B is a schematic diagram of a structure of a reinforcement member with a notched skirt edge viewed from a concave side of a bottom edge according to an embodiment of this application.

FIG. 11A is a schematic diagram of a structure of a reinforcement member with a notched skirt edge viewed from a protruding side of a bottom edge according to an embodiment of this application; and FIG. 11B is a schematic diagram of a structure of a reinforcement member with a notched skirt edge viewed from a concave side of a bottom edge according to an embodiment of this application. With reference to FIG. 9, it can be learned that when the reinforcement member 160 passes through the contact area 170 that is formed by the extension end of the flat cable 140 and the large surface of the screen outlet line 120, the protruding part of the reinforcement member 160 faces the back of the device (that is, faces the battery), and the parts that are of the skirt edge 162 and that are at the upper and lower left corners of the reinforcement member 160 are in contact with the contact area 170. Therefore, to avoid increasing the thickness of the contact position, the parts that are of the skirt edge 162 and that are at the upper and lower left corners of the reinforcement member 160 are cut off, or the parts that are of the skirt edge 162 and that are at the upper and lower left corners of the reinforcement member 160 and a part that is of the middle edge 163 and that is adjacent to the skirt edge are cut off, so as to form a first notch 164 and a second notch 165, as shown in FIG. 11A. The state of the reinforcement member 160 with the notched skirt edge that is shown in FIG. 11A is a protruding state, that is, the bottom edge 161 is higher than the skirt edge 162.

With reference to FIG. 6A, it can be learned that when the reinforcement member 160 with the notched skirt edge is disposed, in a concave structure, at the position of the middle frame hole 132, a state of the reinforcement member 160 with the notched skirt edge is that the bottom edge 161 is a concave state, that is, the bottom edge 161 is lower than the skirt edge 162, as shown in FIG. 11B.

Figure 12A:
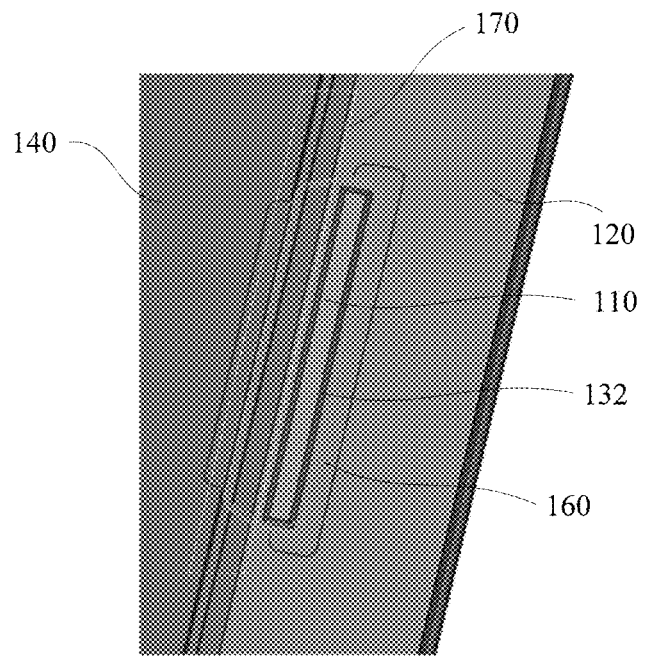
FIG. 12A is a perspective view of a structure of a reinforcement member with a notched skirt edge disposed in a contact area according to an embodiment of this application.
Figure 12B:
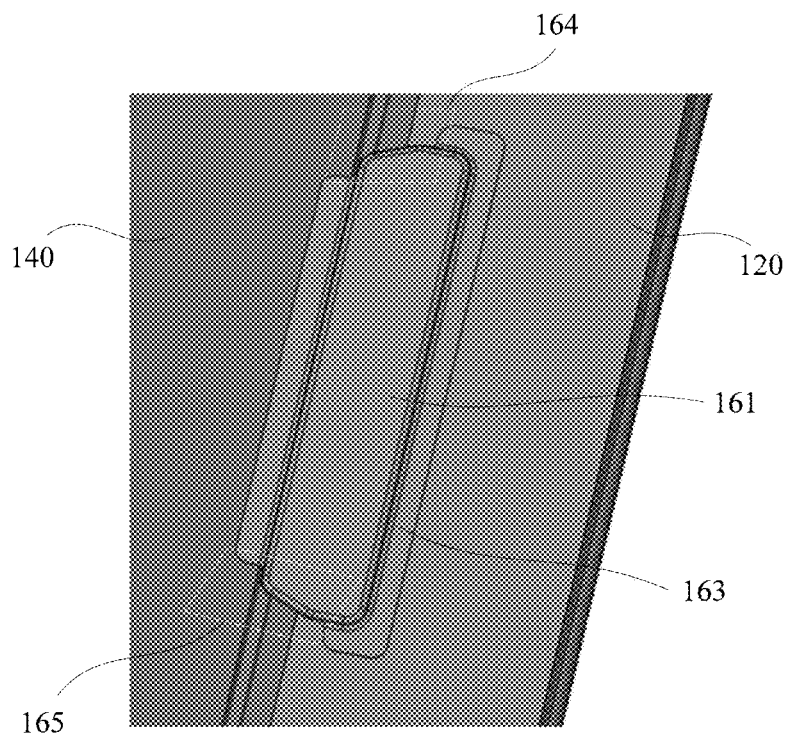
FIG. 12B is an effect diagram of a structure of a reinforcement member with a notched skirt edge disposed in a contact area according to an embodiment of this application.

FIG. 12A is a perspective view of a structure of a reinforcement member with a notched skirt edge disposed in a contact area according to an embodiment of this application; and FIG. 12B is an effect diagram of a structure of a reinforcement member with a notched skirt edge disposed in a contact area according to an embodiment of this application. Referring to FIG. 12A, a contact area 170 (a white dashed line frame) is formed by the flat cable 140 and the screen outlet line 120. When the reinforcement member 160 is disposed at a position of the middle frame hole 132 so that the protruding screen chip 110 is accommodated by the reinforcement member 160, both the upper and lower left corners of the reinforcement member 160 pass through the contact area 170. In this case, the reinforcement member 160 presents a protruding state.

To avoid increasing the height of the reinforcement member 160 passing through the contact area 170, which increases the overall thickness, the parts that are of the skirt edge 162 and that are at the upper and lower left corners of the contact area 170 may be cut off, that is, a height formed by the contact area 170 is accommodated by using the formed first notch 164 and second notch 165. Referring to FIG. 12B, a height of one end of the contact area 170 is accommodated by the first notch 164 of the reinforcement member 160, and a height of the other end of the contact area 170 is accommodated by the second notch 165 of the reinforcement member 160. The two notched parts of the skirt edge 162 are no longer fastened to the middle frame 131, and are in a suspended state, and the remaining part of the skirt edge 162 is fastened to the middle frame 131.

At the positions of the first notch 164 and the second notch 165, the reinforcement member 160 is not in contact with the contact area 170. Therefore, at the positions, the reinforcement member 160 does not have a thickness higher than one layer of the flat cable 140, and therefore the overall thickness of the electronic device is not increased.

In some embodiments, the start point and the end point of the first notch 164 or the second notch 165 in the reinforcement member 160 are determined to ensure that the reinforcement member 160 is not in contact with the contact area 170. For example, a distance between the start point (the end point) and the contact area 170 may be set to about 1 mm.

In some embodiments, to offset the increased height (the thickness of the flat cable 140) when the reinforcement member 160 passes through the contact area 170, so as to avoid increasing the overall thickness of the electronic device, changing the structural form of the reinforcement member 160 may also be performing local stamping processing on the skirt edge 162 that is of the reinforcement member 160 and that passes through the contact area 170, so as to form a reinforcement steel sheet with a skirt edge of unequal heights. No component is designed to be disposed between the locally stamped skirt edge and the middle frame 131, and glue dispensing processing is not performed at this position, which can save glue dispensing space of the position and avoid increasing the height of the position.

Figure 13A:
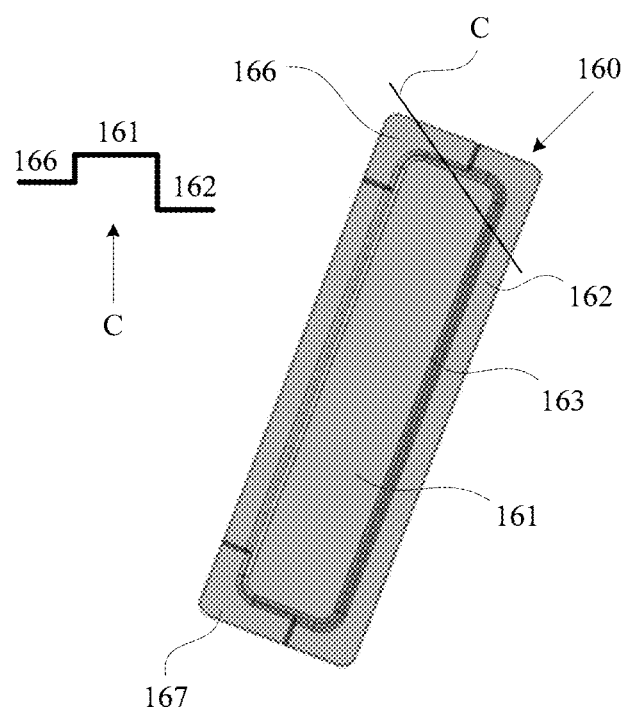
FIG. 13A is a schematic diagram of a structure of a reinforcement member with a skirt edge of unequal heights viewed from a protruding side of a bottom edge according to an embodiment of this application.
Figure 13B:
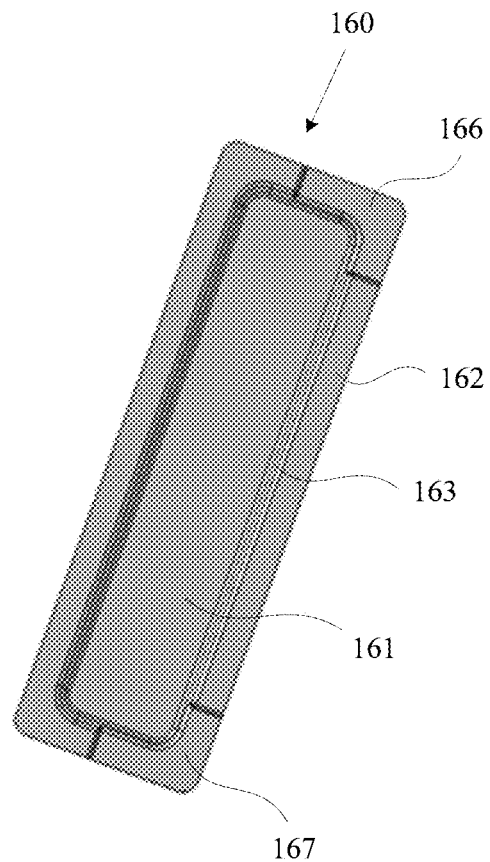
FIG. 13B is a schematic diagram of a structure of a reinforcement member with a skirt edge of unequal heights viewed from a concave side of a bottom edge according to an embodiment of this application.

FIG. 13A is a schematic diagram of a structure of a reinforcement member with a skirt edge of unequal heights viewed from a protruding side of a bottom edge according to an embodiment of this application; and FIG. 13B is a schematic diagram of a structure of a reinforcement member with a skirt edge of unequal heights viewed from a concave side of a bottom edge according to an embodiment of this application. With reference to FIG. 9, it can be learned that when the reinforcement member 160 passes through a contact area 170 that is formed by the extension end of the flat cable 140 and the large surface of the screen outlet line 120, a protruding part of the reinforcement member 160 faces the back of the device, and the parts that are of the skirt edge 162 and that are at the upper and lower left corners of the reinforcement member 160 are in contact with the contact area 170. Therefore, to avoid increasing the height of the contact position, local stamping processing is performed on the parts that are of the skirt edge 162 and that are at the upper and lower left corners of the reinforcement member 160, so as to form a first stamping area 166 and a second stamping area 167, as shown in FIG. 13A. A state of the reinforcement member 160 with a skirt edge of unequal heights shown in FIG. 13A is a protruding state, that is, the bottom edge 161 is higher than the skirt edge 162.

As shown in a cross section C in FIG. 13A, in the structure of the reinforcement member with a skirt edge of unequal heights, the first stamping area 166 and the second stamping area 167 are closer to the bottom edge 161 than the skirt edge 162, that is, a vertical distance between the first stamping area 166 and the bottom edge 161 and a vertical distance between the second stamping area 167 and the bottom edge are both less than a vertical distance between the skirt edge 162 and the bottom edge 161.

With reference to FIG. 6A, it can be learned that when the reinforcement member 160 with a skirt edge of unequal heights is disposed, in a concave structure, at the position of the middle frame hole 132, a state of the reinforcement member 160 with a skirt edge of unequal heights is a concave state, that is, the bottom edge 161 is lower than the skirt edge 162, as shown in FIG. 13B.

Figure 14:
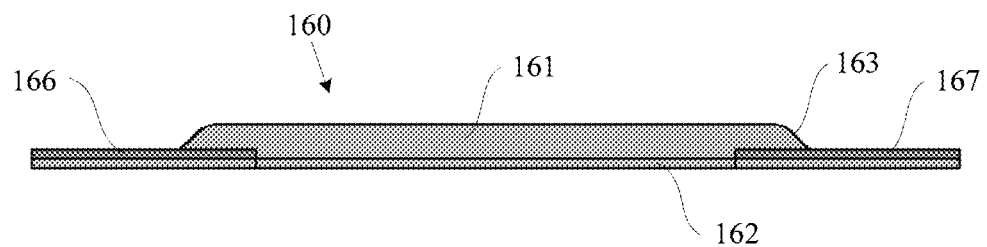
FIG. 14 is a side view of a reinforcement member with a skirt edge of unequal heights shown in FIG. 13A according to an embodiment of this application.

FIG. 14 is a side view of a reinforcement member with a skirt edge of unequal heights shown in FIG. 13A according to an embodiment of this application. Referring to FIG. 14, when the structural form of the reinforcement member 160 is changed through local stamping, a part that is of the skirt edge 162 of the reinforcement member 160 and that may be easily in contact with the contact area 170 is locally raised to form a stamping area. Because the parts that are of the skirt edge of the reinforcement member 160 and that pass through the contact area 170 are located at the upper and lower left corners (that the reinforcement member is in a protruding state is used as an example), local stamping processing may be separately performed on the parts that are of the skirt edge 162 and that are at the upper and lower left corners of the reinforcement member 160, so that the parts that are of the skirt edge 162 and that are at the two positions are locally raised, so as to form the first stamping area 166 and the second stamping area 167.

The first stamping area 166 and the second stamping area 167 protrude a specific height relative to the skirt edge 162 on which local stamping processing is not performed, and a protruding direction of the first stamping area 166 and the second stamping area 167 is the same as a protruding direction of the bottom edge 161 relative to the skirt edge 162.

Because the first stamping area 166 and the second stamping area 167 protrude relative to the skirt edge 162 on which local stamping processing is not performed, at this position, a height of the skirt edge 162 of the reinforcement member 160 is a sum of a height of the stamping area and a height of the skirt edge 162 on which local stamping processing is not performed, so that a height of the stamping area is greater than the height of the skirt edge 162 on which local stamping processing is not performed, so as to form the reinforcement member 160 with a skirt edge of unequal heights.

In an example in which the reinforcement member 160 shown in FIG. 13B is in a concave state, the first stamping area 166 and the second stamping area 167 sink by a specific height relative to the skirt edge 162 on which local stamping processing is not performed, and a sinking direction is the same as a sinking direction of the bottom edge 161 relative to the skirt edge 162.

Figure 15A:
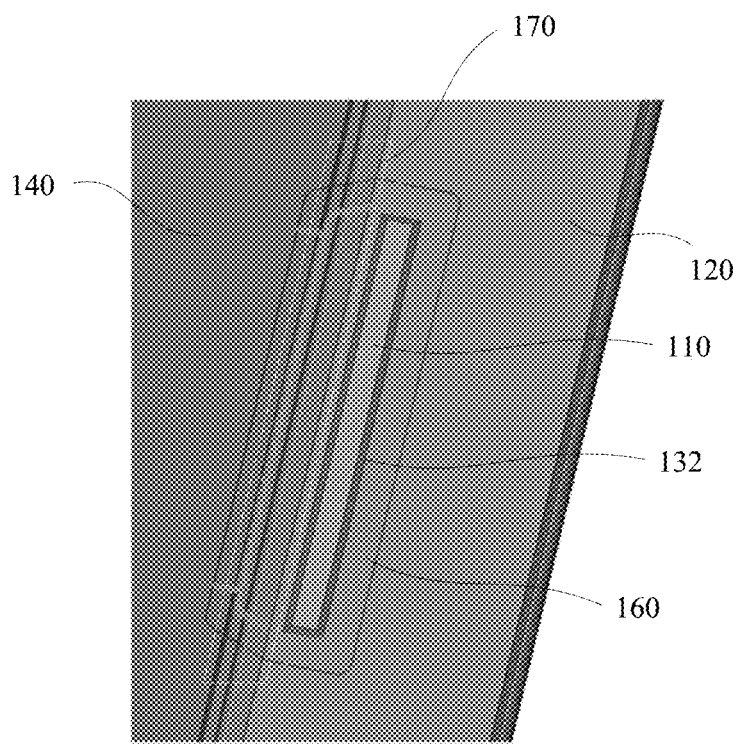
FIG. 15A is a perspective view of a structure of a reinforcement member with a skirt edge of unequal heights disposed in a contact area according to an embodiment of this application.
Figure 15B:
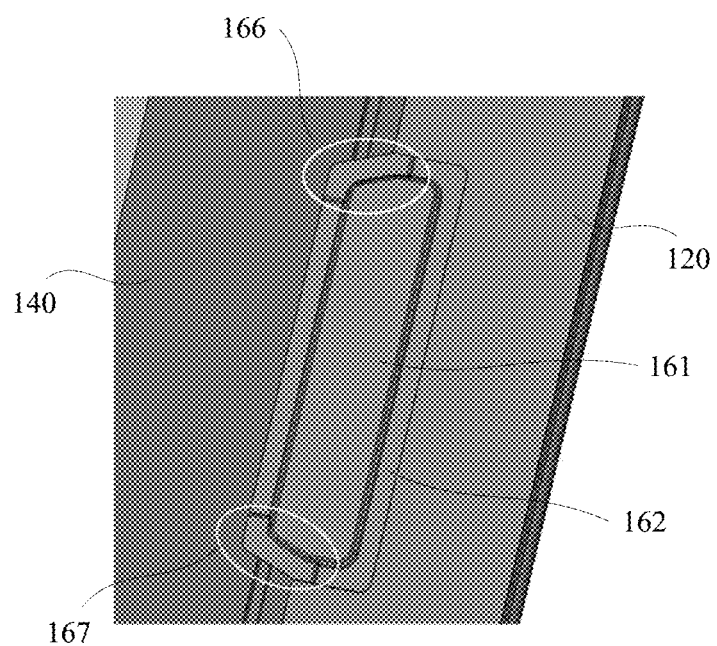
FIG. 15B is an effect diagram of a structure of a reinforcement member with a skirt edge of unequal heights disposed in a contact area according to an embodiment of this application.

FIG. 15A is a perspective view of a structure of a reinforcement member with a skirt edge of unequal heights disposed in a contact area according to an embodiment of this application; and FIG. 15B is an effect diagram of a structure of a reinforcement member with a skirt edge of unequal heights disposed in a contact area according to an embodiment of this application. Referring to FIG. 15A, a contact area 170 (a white dashed line frame) is formed by the flat cable 140 and the screen outlet line 120. When the reinforcement member 160 is disposed at a position of the middle frame hole 132 so that the protruding screen chip 110 is accommodated by the reinforcement member 160, both the upper and lower left corners of the reinforcement member 160 pass through the contact area 170. In this case, the reinforcement member 160 presents a protruding state.

To avoid increasing the height of the part caused by the reinforcement member 160 passing through the contact area 170, the parts that are of the skirt edge 162 and that are at the upper and lower left corners of the contact area are locally stamped, that is, a height formed by the contact area 170 is accommodated by using the formed first stamping area 166 and second stamping area 167. Referring to FIG. 15B, a height of one end of the contact area 170 is accommodated by the first stamping area 166 of the reinforcement member 160, and a height of the other end of the contact area 170 is accommodated by the second stamping area 167 of the reinforcement member 160.

During mounting of the reinforcement member 160, a contact between the skirt edge 162 and the large surface of the screen outlet line 120 and a contact between the skirt edge 162 and the flat cable 140 may be connected through glue dispensing (or spot welding or adhesive). However, because two stamping areas of the reinforcement member 160 with a skirt edge of unequal heights protrude relative to the remaining part of the skirt edge 162, there is a distance between the first stamping area 166 and the contact area 170 and between the second stamping area 167 and the contact area 170, and a vertical distance between the first stamping area 166 and the bottom edge 161 and a vertical distance between the second stamping area 167 and the bottom edge 161 are both less than a vertical distance between the skirt edge 162 and the bottom edge 161, that is, the two stamping areas are in a suspended state, so that the two suspended stamping areas can accommodate a height formed by the contact area 170. Therefore, when the two stamping areas pass through the contact area 170, glue dispensing is no longer performed.

In some embodiments, the reinforcement member 160 performs stamping processing on a part of the skirt edge 162, and the stamping areas (166 and 167) are raised integrally in a protruding direction of the bottom edge 161, so that the stamping areas form a groove relative to the remaining part of the skirt edge 162. Because the height of the contact area 170 is about 0.1-0.15 mm, the raised heights of the two stamping areas (166 and 167) are set to 0.1-0.15 mm, so that the depth of the groove formed by the stamping areas (166 and 167) relative to the remaining part of the skirt edge 162 is about 0.1-0.15 mm.

When the reinforcement member 160 with a skirt edge of unequal heights is fastened, because the thickness of the glue dispensing (or spot welding or adhesive) layer is about 0.1 mm, the thickness of the glue dispensing layer is less than or equal to the depth of the groove formed by the stamping areas (166 and 167) relative to the remaining part of the skirt edge 162, glue dispensing may not be performed at a position in which the two stamping areas (166 and 167) pass through the contact area 170, thereby saving glue dispensing space at the position, and avoiding increasing a height of the position. However, glue dispensing is only performed on the remaining part of the skirt edge 162, so as to fasten the reinforcement member 160. In this case, the two stamping areas (166 and 167) are suspended relative to the contact area 170, and the height of the contact area 170 is accommodated by the groove formed by the two stamping areas (166 and 167), so that the overall height of the reinforcement member 160 does not increase when the reinforcement member 160 is fastened, and the overall thickness of the electronic device is not increased.

At the positions of the first stamping area 166 and the second stamping area 167, the reinforcement member 160 is not in contact with the contact area 170. Therefore, at the positions, the reinforcement member 160 does not have a thickness higher than one layer of the flat cable 140, and therefore the overall thickness of the electronic device is not increased.

In some embodiments, the start point and the end point of the first stamping area 166 and the second stamping area 167 in the reinforcement member 160 are determined to ensure that the reinforcement member 160 is not in contact with the contact area 170. For example, a distance between the start point (the end point) and the contact area 170 may be set to about 1 mm.

According to the electronic device provided in this embodiment of this application, the reinforcement member 160 is disposed at the position of the middle frame hole 132, so as to improve reliability of the middle frame 131 and prevent the screen chip 110 from continuously sinking. To reduce the overall thickness of the electronic device, in terms of the structural form, the reinforcement member 160 may be a reinforcement member with a notched skirt edge or a reinforcement member with a skirt edge of unequal heights. Specifically, the first gap 164 and the second gap 165 that are formed by the reinforcement member 160 with a notched skirt edge accommodate the height of the contact area 170 that is formed by the extension end of the flat cable 140 and the large surface of the screen outlet line 120, or the first stamping area 166 and the second stamping area 167 that are formed by the reinforcement member 160 with a skirt edge of unequal heights accommodate the height of the contact area 170 that is formed by the extension end of the flat cable 140 and the large surface of the screen outlet line 120. In the foregoing two manners, an increase in a local height may be avoided when the skirt edge 162 passes through the contact area 170, thereby avoiding increasing the overall thickness of the electronic device.

It should be noted that the structural form of the reinforcement member 160 is not limited to the form provided in the foregoing embodiment; and the reinforcement member 160 may be in another structural form, provided that a local height is not increased when the reinforcement member 160 passes through the contact area 170, which is not specifically limited herein.

In some embodiments, one screen chip may be disposed in the electronic device provided in the foregoing embodiment. However, to improve efficiency of turning on the display, alternatively, two screen chips may be disposed in the electronic device. For example, the two screen chips may be sequentially arranged in the length direction of the device.

Figure 16:
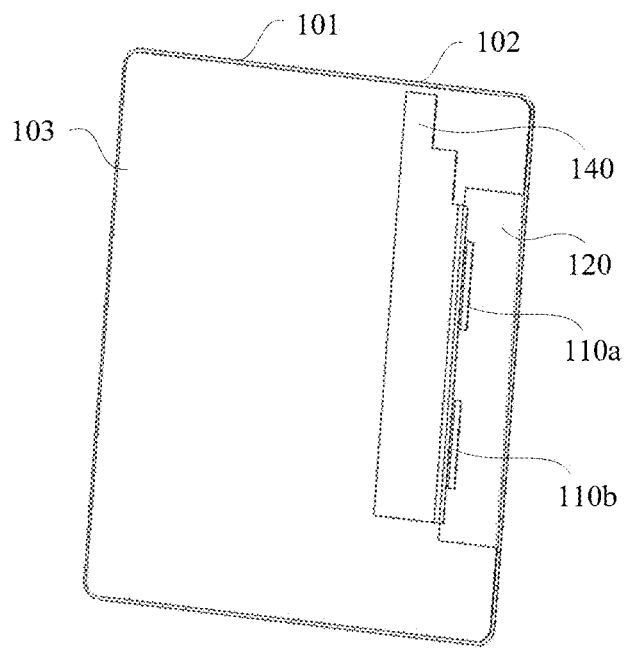
FIG. 16 is a front perspective view when two screen chips are disposed in an electronic device according to an embodiment of this application.

FIG. 16 is a front perspective view when two screen chips are disposed in an electronic device according to an embodiment of this application. Referring to FIG. 16, two screen chips are disposed in the electronic device. The first screen chip 110a and the second screen chip 110b are sequentially arranged in a length direction of the device, and are sequentially laminated to the large surface of the screen outlet line 120. Both the first screen chip 110a and the second screen chip 110b are located above the battery 150. A distance between the two screen chips is set to maximize utilization of the internal space of the device, so as to make full use of the internal space of the device while ensuring data transmission and avoiding increasing the overall thickness of the device.

In this case, the large surface (equivalent to the position of the gasket 121) of the screen outlet line 120 includes two protruding screen chips (110a and 110b). Therefore, in addition to avoiding the protruding structure of the screen chip to reduce the overall thickness of the electronic device, the two screen chips (110a and 110b) need to be avoided. For information about shapes, sizes, structures, and positions of the two screen chips (110a and 110b), refer to description about the case in which one screen chip is disposed in the foregoing embodiment. Details are not described herein again.

In some embodiments, to reduce the overall thickness of the electronic device, in the electronic device provided in this embodiment of this application, internal components of the electronic device are improved, that is, a hole is provided at a position that is at the bottom (a middle frame 131) of the battery compartment 130 and that is opposite to two screen chips (110a and 110b), two middle frame holes (132a and 132b) are formed on the middle frame 131, and the protruding screen chips (110a and 110b) are avoided by the middle frame holes (132a and 132b), which does not increase a thickness of the remaining part of the middle frame 131, thereby reducing the overall thickness.

Figure 17:
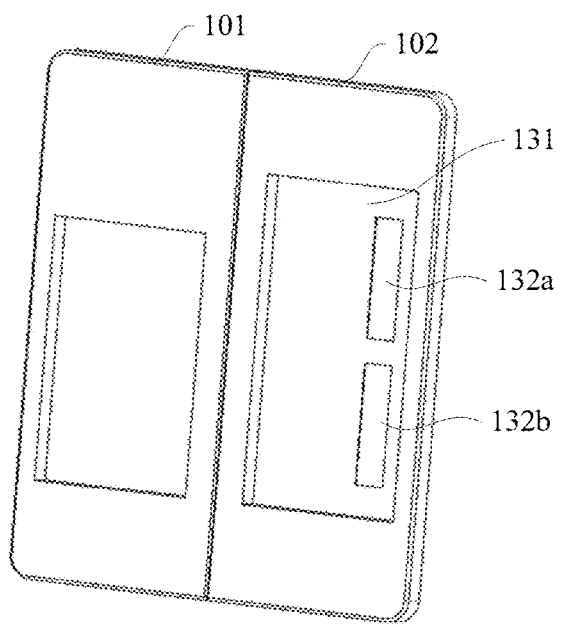
FIG. 17 is a rear perspective view when two middle frame holes are provided in a battery compartment according to an embodiment of this application.

FIG. 17 is a rear perspective view when two middle frame holes are provided in a battery compartment according to an embodiment of this application. Referring to FIG. 17, a first middle frame hole 132a and a second middle frame hole 132b are disposed at the bottom (the middle frame 131) of the battery compartment 130 in a length direction of the electronic device. Positions of the first middle frame hole 132a and the second middle frame hole 132b are opposite to positions of the first screen chip 110a and the second screen chip 110b that are laminated to the large surface. That is, the position of the first middle frame hole 132a is opposite to the position of the first screen chip 110a, and the position of the second middle frame hole 132*b* is opposite to the position of the second screen chip 110*b*. A distance between the two middle frame holes (132*a* and 132*b*) matches a distance between the two screen chips (110*a* and 110*b*).

For information about shapes, sizes, and structures of the two middle frame holes (132*a* and 132*b*), refer to description about the case in which one middle frame hole 132 is disposed in the battery compartment in the foregoing embodiment. Details are not described herein again.

Figure 18:
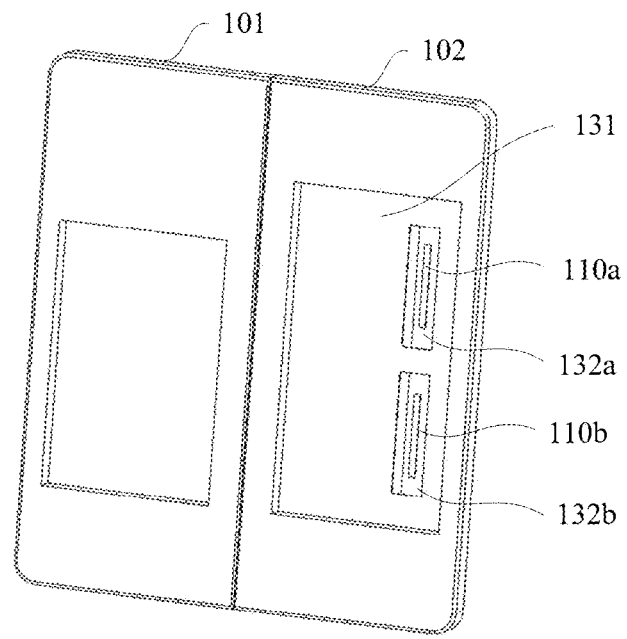
FIG. 18 is a rear perspective view when two screen chips are accommodated by two middle frame holes according to an embodiment of this application.

FIG. 18 is a rear perspective view when two screen chips are accommodated by two middle frame holes according to an embodiment of this application. Referring to FIG. 18, when two screen chips (110*a* and 110*b*) are accommodated by two middle frame holes (132*a* and 132*b*), the first screen chip 110*a* is accommodated by the first middle frame hole 132*a*, so that the first screen chip 110*a* can be fully embedded in the first middle frame hole 132*a*; and the second screen chip 110*b* is accommodated by the second middle frame hole 132*b*, so that the second screen chip 110*b* can be fully embedded in the second middle frame hole 132*b*.

In some embodiments, because the extension end of the flat cable 140 is laminated to the large surface of the screen outlet line 120, the extension end of the flat cable 140 is also higher than the large surface to form a protruding structure. A thickness of the extension end of the flat cable 140 needs to be less than the thickness of the screen chip 110, so as to avoid a larger avoidance space at the middle frame 131, thereby avoiding increasing the overall thickness. In addition to avoiding the first screen chip 110*a* by using the first middle frame hole 132*a* and avoiding the second screen chip 110*b* by using the second middle frame hole 132*b*, the extension end of the flat cable 140 also needs to be avoided. Therefore, sizes of the two middle frame holes (132*a* and 132*b*) are larger than a total size of the corresponding screen chips (110*a* and 110*b*) and the flat cable 140. For details about the implementation, reference may be made to related description about the case in which one middle frame hole 132 is provided in the battery compartment in the foregoing embodiment, and details are not described herein again.

In the electronic device provided in this embodiment of this application, two screen chips (110*a* and 110*b*) are disposed in the electronic device, and the two screen chips (110*a* and 110*b*) form protruding structures relative to the large surface of the screen outlet line 120. While it is ensured that the middle frame 131 and the large surface meet a requirement for a minimum safety gap, to avoid contact between the middle frame 131 and the two screen chips (110*a* and 110*b*), the middle frame 131 needs to avoid the two screen chips (110*a* and 110*b*). In the avoidance manner in this embodiment of this application, two middle frame holes (132*a* and 132*b*) are disposed at positions of the middle frame 131 relative to two screen chips (110*a* and 110*b*), the first middle frame hole 132*a* accommodates the first screen chip 110*a*, and the second middle frame hole 132*b* accommodates the second screen chip 110*b*, so that the two screen chips (110*a* and 110*b*) are prevented from moving downward to be in contact with the middle frame 131 when a user presses the display, thereby avoiding damage. In addition, in the manner of avoiding the screen chips by middle frame holes, the wall thickness of the middle frame 131 is not increased, and only a minimum wall thickness that meets a reliability requirement needs to be set. It can be learned that, in this avoidance manner, the internal space of the electronic device can be fully used, and the wall thickness of the middle frame 131 can be reduced while the two screen chips (110*a* and 110*b*) are avoided, thereby further reducing the overall thickness of the electronic device.

In some embodiments, to avoid two screen chips (110*a* and 110*b*), two middle frame holes (132*a* and 132*b*) are disposed in a hollow-out manner at relative positions at the bottom (middle frame 131) of the battery compartment 130. In this case, the two screen chips (110*a* and 110*b*) are not separated from the battery 150 by the middle frame 131, and the two middle frame holes (132*a* and 132*b*) are provided on the middle frame 131, which reduces reliability of the middle frame 131. Therefore, from a perspective of avoiding significant deformation of the two screen chips (110*a* and 110*b*) and protecting the battery 150, corresponding reinforcement members (160*a* and 160*b*) may be separately disposed at positions of the two middle frame holes (132*a* and 132*b*). The two reinforcement members (160*a* and 160*b*) are used for supporting and positioning, so as to improve reliability of the middle frame 131, and avoid significant deformation of the two screen chips (110*a* and 110*b*) due to applied force. The two reinforcement members (160*a* and 160*b*) prevent the two screen chips (110*a* and 110*b*) from continuously sinking, to avoid damage caused by contact between the two screen chips (110*a* and 110*b*) and the battery 150, and prevent the battery 150 from being damaged by the two screen chips (110*a* and 110*b*), so as to avoid a risk.

Figure 19:
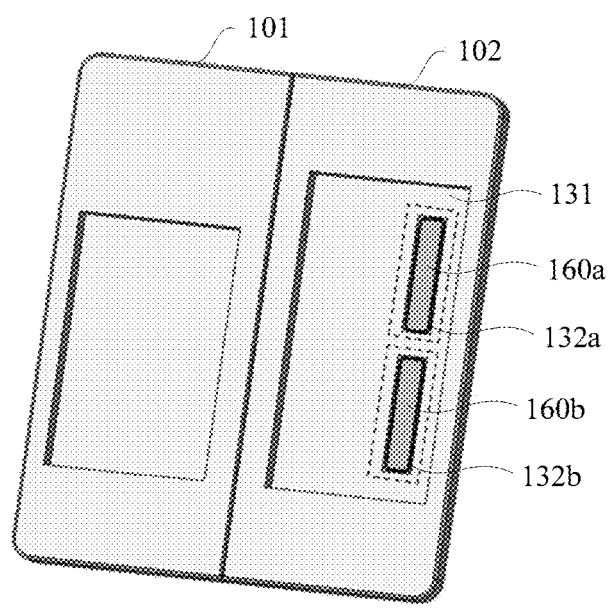
FIG. 19 is a rear perspective view when two reinforcement members are disposed at positions of two middle frame holes according to an embodiment of this application.

FIG. 19 is a rear perspective view when two reinforcement members are disposed at positions of two middle frame holes according to an embodiment of this application. Referring to FIG. 19, on the basis of the solution for reducing the overall thickness of the electronic device provided in the foregoing embodiment, a first reinforcement member 160*a* is disposed at the position of the first middle frame hole 132*a*, and a second reinforcement member 160*b* is disposed at the position of the second middle frame hole 132*b*. The two reinforcement members (160*a* and 160*b*) are of the same structure, and both include a bottom edge, a skirt edge, and a middle edge. For information about structures, materials, mounting manners, and lamination manners of the two reinforcement members (160*a* and 160*b*), refer to related description about the case in which one reinforcement member 160 is disposed in the middle frame hole 132 in the foregoing embodiment. Details are not described herein again.

The first dashed-line box in FIG. 19 is a boundary of the skirt edge of the first reinforcement member 160*a*, and the second dashed-line box is a boundary of the skirt edge of the second reinforcement member 160*b*. In a state shown in FIG. 19, the two reinforcement members (160*a* and 160*b*) are disposed in a protruding state, and corresponding screen chips (110*a* and 110*b*) are respectively disposed below the two reinforcement members (160*a* and 160*b*).

Skirt edges of the two reinforcement members (160*a* and 160*b*) are located between corresponding screen chips and the middle frame 131, and corresponding middle frame holes pass through the bottom edge structures of the two reinforcement members (160*a* and 160*b*). The skirt edge of the first reinforcement member 160*a* is located between the first screen chip 110*a* and the middle frame 131, and is configured to prevent the first screen chip 110*a* from being in contact with the battery 150 when the first screen chip 110*a* sinks due to applied force. The first middle frame hole 132*a* passes through the bottom edge structure of the first reinforcement member 160*a*, so as to implement an effect of accommodating the first screen chip 110*a* by the protruding part of the first reinforcement member 160*a*. The skirt edge of the second reinforcement member 160b is located between the second screen chip 110b and the middle frame 131, and is configured to prevent the second screen chip 110b from being in contact with the battery 150 when the second screen chip 110b sinks due to applied force. The second middle frame hole 132b passes through the bottom edge structure of the second reinforcement member 160b, to implement an effect of accommodating the second screen chip 110b by the protruding part of the second reinforcement member 160b.

A complete structure obtained after the two reinforcement members (160a and 160b) are taken out from the electronic device is shown in FIG. 7. A structural form of the two reinforcement members (160a and 160b) may be a reinforcement member with a notched skirt edge shown in FIG. 11A and FIG. 11B, or a reinforcement member with a skirt edge of unequal heights shown in FIG. 13A and FIG. 13B. For an implementation solution for avoiding the contact area 170 by a structural form of two reinforcement members (160a and 160b), refer to description about avoiding the contact area 170 by the reinforcement member 160 in the foregoing embodiment. Details are not described herein again.

The two screen chips (110a and 110b) are separated from the battery 150 by using bottom edges of the two reinforcement members (160a and 160b). If the user presses the display to cause significant deformation of the two screen chips (110a and 110b), the bottom edges of the two reinforcement members (160a and 160b) may prevent corresponding screen chips (110a and 110b) from continuously sinking, so as to avoid contact with the battery 150. Even if the two screen chips (110a and 110b) are damaged because of contact with the bottom edges of the corresponding reinforcement members, the two reinforcement members (160a and 160b) may hold fragments, to prevent the fragments from being in contact with the battery 150, so as to protect the battery 150.

According to the electronic device provided in this embodiment of this application, to reduce the overall thickness of the electronic device, two middle frame holes (132a and 132b) are disposed at the positions of the middle frame 131 relative to the two screen chips (110a and 110b), the two middle frame holes (132a and 132b) accommodate corresponding screen chips (110a and 110b), and the middle frame 131 has a minimum wall thickness. In addition, corresponding reinforcement members (160a and 160b) are disposed at the positions of the two middle frame holes (132a and 132b), and the reinforcement members (160a and 160b) are used for supporting and positioning, so as to improve reliability of the middle frame 131, prevent the corresponding screen chips (110a and 110b) from continuously sinking, thereby avoiding damage caused by contact between the two screen chips (110a and 110b) and the battery 150 and protecting the battery 150. It can be learned that the two middle frame holes (132a and 132b) and the two reinforcement members (160a and 160b) are disposed on the middle frame 131, so as to improve reliability of the middle frame 131 and avoid the two protruding screen chips (110a and 110b), thereby reducing an overall thickness of an electronic device.

In some embodiments, when two screen chips (110a and 110b) are disposed in the electronic device, one middle frame hole 132 may alternatively be provided on the middle frame 131, and the middle frame hole 132 can accommodate the two screen chips. In this case, structural features such as a size and a shape of the only middle frame hole need to match the structural features such as a size and a shape of an area enclosed by the two screen chips, that is, a size of the middle frame hole 132 is greater than a size that is enclosed by the first screen chip 110a and the second screen chip 110b. For the solution for accommodating two screen chips by one middle frame hole, refer to description in the foregoing embodiments. Details are not described herein again.

It can be learned from the foregoing technical solutions that, in the electronic device provided in the embodiments of this application, to resolve a problem that the overall thickness of the electronic device increases due to a local protrusion inside a device, while it is ensured that the middle frame 131 and the large surface of the screen outlet line 120 meet a requirement for a minimum safety gap, a position corresponding to the screen chip 110 on the middle frame 131 is hollowed out to form the middle frame hole 132, so as to avoid contact between the middle frame 131 and the screen chip 110, so that the screen chip 110 is accommodated in the space of the wall thickness of the middle frame 131. In this manner of avoiding the screen chip 110, only a minimum wall thickness that meets a reliability requirement needs to be set. In addition, the reinforcement member 160 is disposed at a position of the middle frame hole 132, and the reinforcement member 160 is used for supporting and positioning, so as to improve reliability of the middle frame 131 and prevent the screen chip 110 from continuously sinking. Furthermore, the clamping slot 133 on the middle frame 131 accommodates the skirt edge 162 of the reinforcement member 160, to avoid that the top of the skirt edge 162 is exposed beyond the top of the middle frame 131, so as to ensure that a minimum safety gap is reserved between the middle frame 131 and the large surface of the screen outlet line 120, thereby reducing the overall thickness of the electronic device. A structural form of the reinforcement member 160 may be a reinforcement member with a notched skirt edge or a reinforcement member with a skirt edge of unequal heights, to avoid a height of the contact area 170 formed by the flat cable 140 and the screen outlet line 120, so as to avoid increasing the overall thickness of the electronic device. It can be learned that the internal space of the electronic device can be fully used, so that the wall thickness of the middle frame 131 is reduced, and the height formed by contact between adjacent components is avoided while the screen chip 110 is avoided, thereby further reducing the overall thickness of the electronic device.

It should be noted that a person skilled in the art may easily think of another implementation solution of this application after considering the specification and practicing the application disclosed herein. This application is intended to cover any variations, uses, or adaptations of this application. These variations, uses, or adaptations follow the general principles of this application and include common knowledge or conventional technical means in the art that are not disclosed in this application. The specification and embodiments are merely considered as examples, and the true scope and spirit of this application are indicated by the following claims.

It should be understood that this application is not limited to the precise structures described above and shown in the accompanying drawings, and various modifications and changes may be made without departing from the scope thereof. The scope of this application is limited only by the appended claims.

What is claimed is:

1. A foldable screen electronic device, comprising:
   a housing;
   a display disposed on the housing;

a cavity formed by the housing and the display;
a middle frame provided with a middle frame hole penetrating the middle frame;
a screen chip;
a screen outlet line disposed on a first side of the middle frame and connected to one end of the display;
a battery disposed on a second side of the middle frame, wherein the first side of the middle frame faces towards the display, and wherein the second side of the middle frame faces away from the display; and
a reinforcement member disposed between the screen chip and the battery;
  wherein the middle frame, the screen chip, the screen outlet line and the battery are disposed in the cavity;
  wherein a surface of the screen outlet line is located between the display and the middle frame, wherein the surface of the screen outlet line is part of the screen outlet line that is bent along a direction from the display to a back of the foldable screen electronic device and is located between the display and the middle frame;
  wherein the screen chip is disposed on the surface of the screen outlet line and is located between the display and the battery;
  wherein a protruding structure formed by the screen chip relative to the surface of the screen outlet line is located in the middle frame hole, and a protruding height of the protruding structure is less than a depth of the middle frame hole; and
  wherein the reinforcement member is fastened around the middle frame hole and is configured to prevent the screen chip from being in contact with the battery when the screen chip sinks due to applied force.

2. The foldable screen electronic device of claim 1, further comprising:
a flat cable disposed in the cavity;
wherein one end of the flat cable extends to a third side of the surface, the screen chip is disposed on the third side of the surface, a thickness of one end of the flat cable is less than or equal to a thickness of the screen chip, and one end of the flat cable is located in the middle frame hole.

3. The foldable screen electronic device of claim 2, wherein a size of the middle frame hole is greater than a size that is enclosed by one end of the screen chip and the flat cable.

4. The foldable screen electronic device of claim 1,
wherein the reinforcement member comprises a bottom edge, a skirt edge, and a middle edge; and
wherein the skirt edge is connected to the bottom edge by the middle edge to form a groove structure, wherein the groove structure is configured to accommodate the screen chip.

5. The foldable screen electronic device of claim 4,
wherein the skirt edge is located between the middle frame and the surface of the screen outlet line, and the skirt edge is fastened around the middle frame hole and on the first side of the middle frame; and
wherein the bottom edge is located on a fourth side of the middle frame hole, the fourth side of the middle frame hole is close to the battery; and wherein a vertical distance between the bottom edge and the skirt edge is less than a thickness of the middle frame.

6. The foldable screen electronic device of claim 4,
wherein a clamping slot for fastening the skirt edge is disposed on the middle frame, the clamping slot is located around the middle frame hole and is close to the surface; and
wherein a depth of the clamping slot is greater than a thickness of the skirt edge.

7. The foldable screen electronic device of claim 6, wherein a first notch and a second notch for accommodating a contact area are disposed on the skirt edge, and the contact area is an area that is formed by contact between one end of the flat cable and the surface of the screen outlet line.

8. The foldable screen electronic device of claim 6, wherein a first stamping area and a second stamping area that are used to accommodate a contact area are disposed on the skirt edge, and the contact area is an area that is formed by contact between an extension end of the flat cable and the surface of the screen outlet line.

9. The foldable screen electronic device of claim 8, wherein a vertical distance between the first stamping area and the bottom edge is less than a vertical distance between the skirt edge and the bottom edge, and a vertical distance between the second stamping area and the bottom edge is less than the vertical distance between the skirt edge and the bottom edge.

10. The foldable screen electronic device of claim 1,
wherein the screen chip comprises a first screen chip and a second screen chip that are sequentially disposed on the surface of the screen outlet line; and
wherein a size of the middle frame hole is greater than a size that is enclosed by the first screen chip and the second screen chip, and wherein the middle frame hole is configured to accommodate the first screen chip and the second screen chip.

11. The foldable screen electronic device of claim 10,
wherein the middle frame hole comprises a first middle frame hole and a second middle frame hole;
wherein the first middle frame hole is used to accommodate the first screen chip; and
wherein the second middle frame hole is used to accommodate the second screen chip.

12. The foldable screen electronic device of claim 11,
wherein the reinforcement member comprises a first reinforcement member and a second reinforcement member;
wherein the first reinforcement member is located between the first screen chip and the battery, and the first reinforcement member is configured to prevent the first screen chip from being in contact with the battery when the first screen chip sinks due to applied force; and
wherein the second reinforcement member is located between the second screen chip and the battery, and the second reinforcement member is configured to prevent the second screen chip from being in contact with the battery when the second screen chip sinks due to applied force.

* * * * *